United States Patent
Yoon et al.

(10) Patent No.: US 10,559,332 B1
(45) Date of Patent: Feb. 11, 2020

(54) SEMICONDUCTOR DEVICES

(71) Applicant: SK hynix Inc., Icheon-si Gyeonggi-do (KR)

(72) Inventors: Young Jun Yoon, Icheon-si (KR); Hyun Seung Kim, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/198,263

(22) Filed: Nov. 21, 2018

(30) Foreign Application Priority Data

Jul. 25, 2018 (KR) .......................... 10-2018-0086339

(51) Int. Cl.
    *G11C 7/10* (2006.01)
    *G11C 7/22* (2006.01)
    *G11C 8/10* (2006.01)

(52) U.S. Cl.
    CPC .......... *G11C 7/1063* (2013.01); *G11C 7/1066* (2013.01); *G11C 7/1069* (2013.01); *G11C 7/222* (2013.01); *G11C 8/10* (2013.01)

(58) Field of Classification Search
    CPC ...... G11C 7/1063; G11C 7/1066; G11C 7/222

USPC ................. 365/189.15, 222, 233.11, 233.13
See application file for complete search history.

(56) References Cited

U.S. PATENT DOCUMENTS

| 2015/0302904 A1* | 10/2015 | Yoon .................. G11C 5/04 711/105 |
| 2015/0310904 A1 | 10/2015 | Kim et al. |
| 2019/0138245 A1* | 5/2019 | Shin .................... G11C 7/1018 |

FOREIGN PATENT DOCUMENTS

KR        1020100030510 A      3/2010

* cited by examiner

*Primary Examiner* — Han Yang
(74) *Attorney, Agent, or Firm* — William Park & Associates Ltd.

(57) ABSTRACT

A semiconductor device includes a synthesis control signal generation circuit and a data output control circuit. The synthesis control signal generation circuit generates a synthesis control signal for determining a burst sequence from a latch control signal in response to a first burst mode command and a second burst mode command. The data output control circuit outputs data included in a bank group as internal data in response to the synthesis control signal.

20 Claims, 18 Drawing Sheets

FIG.3

| COMMAND | CS | CLOCK EDGE | CA<1> | CA<2> | CA<3> | CA<4> | CA<5> | CA<6> | CA<7> |
|---|---|---|---|---|---|---|---|---|---|
| RD16 | H | CLKr | H | L | L | C1 | C4 | C5 | C6 |
|  | X | CLKf | BA1 | BA2 | BG1 | BG2 | C2 | C3 | AP |
| RD32 | H | CLKr | H | L | H | C1 | C4 | C5 | C6 |
|  | X | CLKf | BA1 | BA2 | BG1 | BG2 | C2 | C3 | AP |
| CAS | H | CLKr | L | L | H | H | WS_WR | WS_RD | WS_FS |
|  | X | CLKf | DC1 | DC2 | DC3 | DC4 | WRX | V | B3 |

SEMICONDUCTOR DEVICES

CROSS-REFERENCE TO RELATED APPLICATIONS

The present application claims priority under 35 U.S.C 119(a) to Korean Application No. 10-2018-0086339, filed on Jul. 25, 2018, which is incorporated herein by reference in its entirety.

BACKGROUND

1. Technical Field

Various embodiments of the present disclosure generally relate to semiconductor devices controlling data output operations of bank groups.

2. Related Art

In general, a semiconductor device such as a dynamic random access memory (DRAM) device may include a plurality of bank groups comprised of cell arrays which are selected by addresses. Each of the bank groups may be realized to include a plurality of banks. The semiconductor device may select any one of the plurality of bank groups and may perform a read operation for outputting data stored in a cell array included in the selected bank group through input/output (I/O) lines and a write operation for storing data inputted through the I/O lines into the cell array included in the selected bank group.

SUMMARY

According to an embodiment, a semiconductor device includes a synthesis control signal generation circuit and a data output control circuit. The synthesis control signal generation circuit generates a synthesis control signal for determining a burst sequence from a latch control signal in response to a first burst mode command and a second burst mode command. The data output control circuit outputs data included in a bank group as internal data in response to the synthesis control signal. The synthesis control signal after a bubble period may be set to have the same logic level as the synthesis control signal before the bubble period when the second burst mode command is generated.

According to another embodiment, a semiconductor device includes a pulse division circuit and a synthesis control signal generation circuit. The pulse division circuit generates divided pulses and synthesized division pulses in response to a first burst mode command and a second burst mode command. The synthesis control signal generation circuit generates a synthesis control signal for determining a burst sequence from a latch control signal in response to the first burst mode command, the second burst mode command, the divided pulses and the synthesized division pulses. The synthesis control signal after a bubble period may be set to have the same logic level as the synthesis control signal before the bubble period when the second burst mode command is generated.

BRIEF DESCRIPTION OF THE DRAWINGS

FIG. 3 is a table illustrating operations of a command decoder and an address decoder included in the semiconductor device of FIG. 1.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Figure 1:
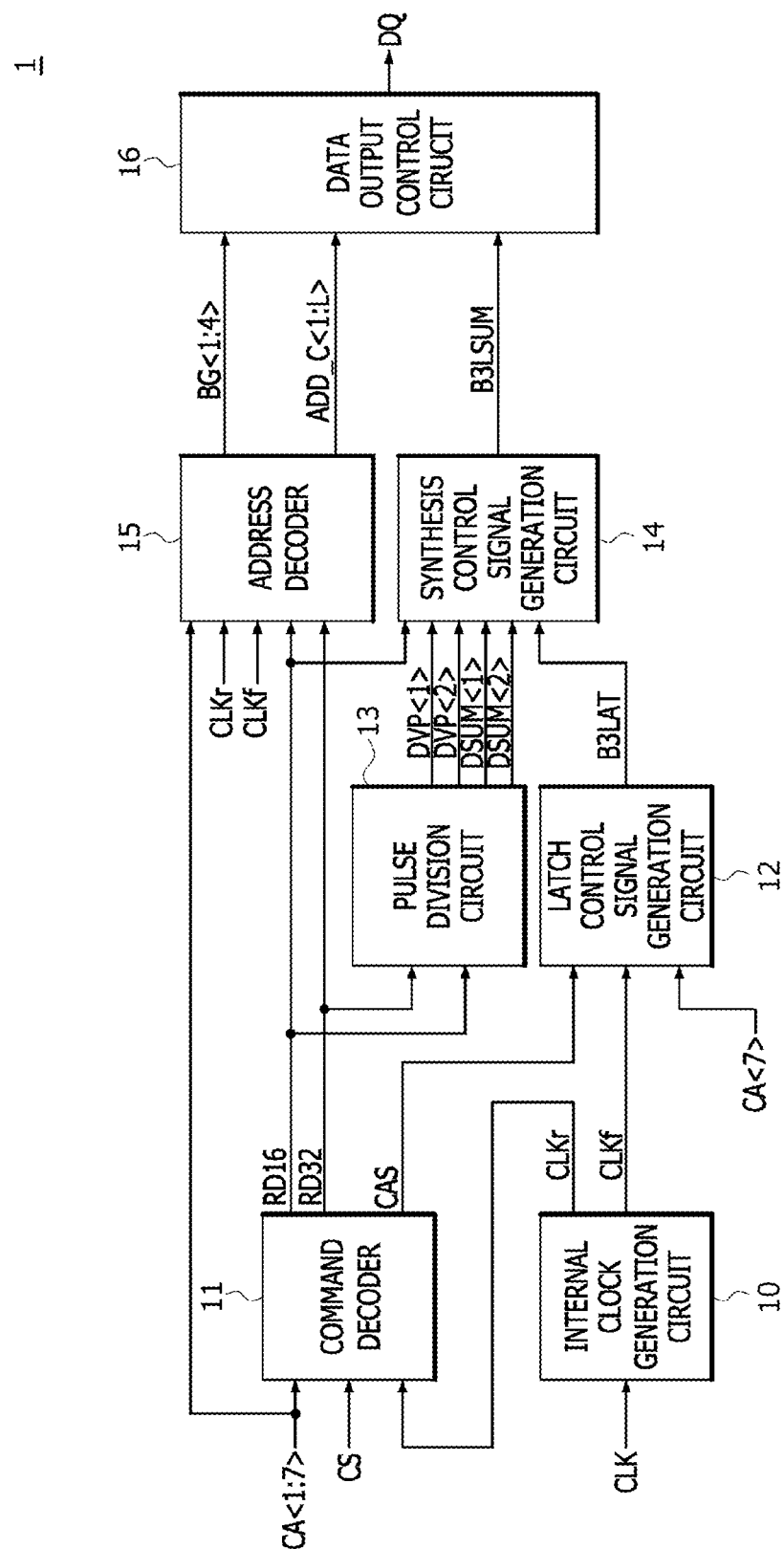
FIG. 1 is a block diagram illustrating a configuration of a semiconductor device according to an embodiment of the present disclosure.

As illustrated in FIG. 1, a semiconductor device 1 according to an embodiment may include an internal clock generation circuit 10, a command decoder 11, a latch control signal generation circuit 12, a pulse division circuit 13, a synthesis control signal generation circuit 14, an address decoder 15, and a data output control circuit 16.

The internal clock generation circuit 10 may generate a first internal clock signal CLKr and a second internal clock signal CLKf from a clock signal CLK. The internal clock generation circuit 10 may buffer the clock signal CLK to generate the first internal clock signal CLKr and may inversely buffer the clock signal CLK to generate the second internal clock signal CLKf. The first internal clock signal CLKr may be generated to have the same phase as the clock signal CLK, and the second internal clock signal CLKf may be generated to have an opposite phase to the clock signal CLK. An operation of the internal clock generation circuit 10 will be described with reference to FIG. 2 later.

The command decoder 11 may generate a first burst mode command RD16, a second burst mode command RD32, and a column address strobe command CAS in response to a command/address signal CA<1:7>, a chip selection signal CS, and the first internal clock signal CLKr. The command decoder 11 may generate the first burst mode command RD16 if the command/address signal CA<1:7> having a first logic level combination is inputted to the command decoder 11 in synchronization with a predetermined edge of the first internal clock signal CLKr in a period that the chip selection signal CS has a predetermined logic level. The first burst mode command RD16 may be generated for a burst operation which is set to have a burst length of '16' in order to output 16-bit data stored in a selected bank group at a time. In the burst operation having a burst length of '16', the 16-bit data may correspond to data stored in a cell array included in a bank group which is selected by bank group addresses (BG1 and BG2 of FIG. 3), bank addresses (BA1 and BA2 of FIG. 3) and column addresses C1~C6. The predetermined logic level of the chip selection signal CS may be set as a logic "low" level or a logic "high" level according to the embodiments. The predetermined edge of the first internal clock signal CLKr may be set as a rising edge or a falling edge according to the embodiments. In some embodiments, the command/address signal CA<1:7> having the first logic level combination may mean a case that some bits included in the command/address signal CA<1:7> have the first logic level combination. The command decoder 11 may generate the second burst mode command RD32 if the command/address signal CA<1:7> having a second logic level combination is inputted to the command decoder 11 in synchronization with a predetermined edge of the first internal clock signal CLKr in a period that the chip selection signal CS has the predetermined logic level. The second burst mode command RD32 may be generated for a burst operation which is set to have a burst length of '32' in order to output 32-bit data stored in a selected bank group at a time. In some embodiments, the command/address signal CA<1:7> having the second logic level combination may mean a case that some bits included in the command/address signal CA<1:7> have the second logic level combination. The command decoder 11 may generate the column address strobe command CAS if the command/address signal CA<1:7> having a third logic level combination is inputted to the command decoder 11 in synchronization with a predetermined edge of the first internal clock signal CLKr in a period that the chip selection signal CS has the predetermined logic level. In some embodiments, the command/address signal CA<1:7> having the third logic level combination may mean a case that some bits included in the command/address signal CA<1:7> have the third logic level combination. An operation of the command decoder 11 will be described with reference to FIG. 3 later.

The latch control signal generation circuit 12 may generate a latch control signal B3LAT from a seventh bit (CA<7>) of the command/address signal CA<1:7> in response to the column address strobe command CAS and the second internal clock signal CLKf. The latch control signal generation circuit 12 may sequentially latch the seventh bit CA<7> of the command/address signal CA<1:7> in synchronization with the second internal clock signal CLKf and the column address strobe command CAS to generate the latch control signal B3LAT. An operation and a configuration of the latch control signal generation circuit 12 will be described with reference to FIG. 4 later.

The pulse division circuit 13 may generate divided pulses DVP<1:2> and synthesized division pulses DSUM<1:2> in response to the first burst mode command RD16 and the second burst mode command RD32. The pulse division circuit 13 may generate the divided pulses DVP<1:2> and the synthesized division pulses DSUM<1:2> if the second burst mode command RD32 is generated to perform a burst operation set to have a burst length of '32'. An operation and a configuration of the pulse division circuit 13 will be described with reference to FIGS. 5 to 12 later.

The synthesis control signal generation circuit 14 may generate a synthesis control signal B3LSUM from the latch control signal B3LAT in response to the first burst mode command RD16, the divided pulses DVP<1:2>, and the synthesized division pulses DSUM<1:2>. The synthesis control signal generation circuit 14 may latch the latch control signal B3LAT in synchronization with the first burst mode command RD16 and may output the latched signal of the latch control signal B3LAT as the synthesis control signal B3LSUM. The synthesis control signal generation circuit 14 may latch the latch control signal B3LAT in synchronization with a first bit DVP<1> of the divided pulses DVP<1:2>. The synthesis control signal generation circuit 14 may latch the latched signal of the latch control signal B3LAT, which is latched by the first bit DVP<1> of the divided pulses DVP<1:2>, according to a first bit DSUM<1> of the synthesized division pulses DSUM<1:2> to generate the synthesis control signal B3LSUM. The synthesis control signal generation circuit 14 may latch the latch control signal B3LAT in synchronization with a second bit DVP<2> of the divided pulses DVP<1:2>. The synthesis control signal generation circuit 14 may latch the latched signal of the latch control signal B3LAT, which is latched by the second bit DVP<2> of the divided pulses DVP<1:2>, according to a second bit DSUM<2> of the synthesized division pulses DSUM<1:2> to generate the synthesis control signal B3LSUM. An operation and a configuration of the synthesis control signal generation circuit 14 will be described with reference to FIG. 13 later.

The address decoder 15 may generate a bank group signal BG<1:4> and an internal address ADD_C<1:L> from the command/address signal CA<1:7> in response to the first internal clock signal CLKr, the second internal clock signal CLKf, the first burst mode command RD16, and the second burst mode command RD32. The internal address ADD_C<1:L> may include the bank addresses (BA1 and BA2 of FIG. 3) for selecting a bank included in a selected bank group and the column addresses (C1~C6 of FIG. 3) for selecting a column path of a cell array included in the selected bank. If the first burst mode command RD16 is generated to perform a burst operation having a burst length of '16', the address decoder 15 may be synchronized with the first internal clock signal CLKr and the second internal clock signal CLKf to select a bank group with the command/address signal CA<1:7> and to generate the bank group signal BG<1:4> and the internal address ADD_C<1:L> for outputting 16-bit data from the selected bank group. If the second burst mode command RD32 is generated to perform a burst operation having a burst length of '32', the address decoder 15 may be synchronized with the first internal clock signal CLKr and the second internal clock signal CLKf to select a bank group with the command/address signal CA<1:7> and to generate the bank group signal BG<1:4> and the internal address ADD_C<1:L> for outputting 32-bit data from the selected bank group.

The data output control circuit 16 may generate internal data DQ in response to the bank group signal BG<1:4>, the internal address ADD_C<1:L>, and the synthesis control signal B3LSUM. The data output control circuit 16 may generate the internal data DQ from data stored in a bank group selected in response to the bank group signal BG<1:4> and the internal address ADD_C<1:L> according to a burst sequence which is set by the synthesis control signal B3LSUM. The data output control circuit 16 may output 16-bit data stored in a bank group selected by the bank group signal BG<1:4> and the internal address ADD_C<1:L> as the internal data DQ if a burst operation set to have a burst length of '16' is performed. If a burst operation set to have a burst length of '32' is performed, the data output control circuit 16 may divide 32-bit data stored in a bank group selected by the bank group signal BG<1:4> and the internal address ADD_C<1:L> into two sets of 16-bit data according to a burst sequence which is set by the synthesis control signal B3LSUM and may output one set of the two sets of 16-bit data as the internal data DQ before a bubble period and the other set of the two sets of 16-bit data as the internal data DQ after the bubble period. More specifically, if a burst operation set to have a burst length of '32' is performed, 32-bit data stored in a bank group selected by the bank group signal BG<1:4> and the internal address ADD_C<1:L> may be divided into a first group of 16-bit data and a second group of 16-bit data. In such a case, if the synthesis control signal B3LSUM has a first logic level, the first group of 16-bit data may be firstly outputted as the internal data DQ and the second group of 16-bit data may be secondly outputted as the internal data DQ after the bubble period elapses from a point of time that the first group of 16-bit data is outputted as the internal data DQ. Alternatively, if the synthesis control signal B3LSUM has a second logic level different from the first logic level, the second group of 16-bit data may be firstly outputted as the internal data DQ and the first group of 16-bit data may be secondly outputted as the internal data DQ after the bubble period elapses from a point of time that the second group of 16-bit data is outputted as the internal data DQ. The bubble period may be set as a time period that 16-bit data are able to be outputted. Thus, a burst operation set to have a burst length of '16' may be performed during the bubble period of a burst operation set to have a burst length of '32'.

Figure 2:
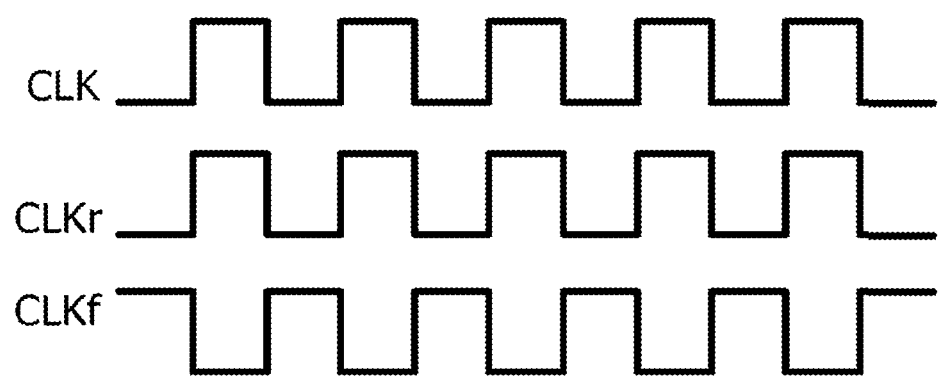
FIG. 2 is a timing diagram illustrating an operation of an internal clock generation circuit included in the semiconductor device of FIG. 1.

Referring to FIG. 2, the first internal clock signal CLKr and the second internal clock signal CLKf generated from the clock signal CLK in the internal clock generation circuit 10 are illustrated. The first internal clock signal CLKr may be generated to have the same phase as the clock signal CLK, and the second internal clock signal CLKf may be generated to have an opposite phase to the clock signal CLK.

Referring to FIG. 3, operations of the command decoder 11 and the address decoder 15 are illustrated.

If the chip selection signal CS has a logic "high" level and the first to third bits CA<1:3> of the command/address signal CA<1:7> have a logic level combination of 'H,L,L' in synchronization with a rising edge of the first internal clock signal CLKr, the first burst mode command RD16 may be generated. In such a case, the fourth to seventh bits CA<4:7> of the command/address signal CA<1:7> may be respectively set as the first column address C1, the fourth column address C4, the fifth column address C5, and the sixth column address C6 in synchronization with a rising edge of the first internal clock signal CLKr. After the first burst mode command RD16 is generated, the first to seventh bits CA<1:7> of the command/address signal CA<1:7> may be respectively set as the first bank address BA1, the second bank address BA2, the first bank group address BG1, the second bank group address BG2, the second column address C2, the third column address C3, and an auto free charge signal AP in synchronization with a rising edge of the second internal clock signal CLKf. The bank group signal BG<1:4> generated by the address decoder 15 may include the first bank group address BG1 and the second bank group address BG2. The internal address ADD_C<1:L> generated by the address decoder 15 may include the first and second bank addresses BA1 and BA2 as well as the first to sixth column addresses C1~C6.

If the chip selection signal CS has a logic "high" level and the first to third bits CA<1:3> of the command/address signal CA<1:7> have a logic level combination of 'H,L,H' in synchronization with a rising edge of the first internal clock signal CLKr, the second burst mode command RD32 may be generated. In such a case, the fourth to seventh bits CA<4:7> of the command/address signal CA<1:7> may be respectively set as the first column address C1, the fourth column address C4, the fifth column address C5, and the sixth column address C6 in synchronization with a rising edge of the first internal clock signal CLKr. After the second burst mode command RD32 is generated, the first to seventh bits CA<1:7> of the command/address signal CA<1:7> may be respectively set as the first bank address BA1, the second bank address BA2, the first bank group address BG1, the second bank group address BG2, the second column address C2, the third column address C3, and the auto free charge signal AP in synchronization with a rising edge of the second internal clock signal CLKf. The bank group signal BG<1:4> generated by the address decoder 15 may include the first bank group address BG1 and the second bank group address BG2. The internal address ADD_C<1:L> generated by the address decoder 15 may include the first and second bank addresses BA1 and BA2 as well as the first to sixth column addresses C1~C6.

If the chip selection signal CS has a logic "high" level and the first to fourth bits CA<1:4> of the command/address signal CA<1:7> have a logic level combination of 'L,L,H,H' in synchronization with a rising edge of the first internal clock signal CLKr, the column address strobe command CAS may be generated. In such a case, the fifth to seventh bits CA<5:7> of the command/address signal CA<1:7> may be respectively set as a first set command WS_WR, a second set command WS_RD, and a third set command WS_FS in synchronization with a rising edge of the first internal clock signal CLKr. The first set command WS_WR may be generated to receive a clock signal which is used in the input/output of data during a write operation. The second set command WS_RD may be generated to receive a clock signal which is used in the input/output of data during a read operation. The third set command WS_FS may be generated to perform a multi-rank operation. After the column address strobe command CAS is generated, the first to seventh bits CA<1:7> of the command/address signal CA<1:7> may be respectively set as a first pattern datum DC1, a second pattern datum DC2, a third pattern datum DC3, a fourth pattern datum DC4, a fixed pattern command WRX, a signal having a valid logic level V, and a control signal B3 for determining a burst sequence in synchronization with a rising edge of the second internal clock signal CLKf. The fixed pattern command WRX may be generated to store the first to fourth pattern data DC1~DC4 into a bank group. The valid logic level V may be set as a logic "high" level or a logic "low" level.

Figure 4:
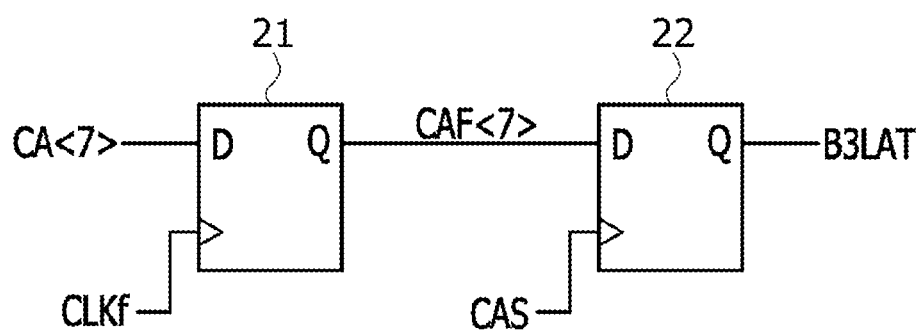
FIG. 4 is a circuit diagram illustrating an example of a latch control signal generation circuit included in the semiconductor device of FIG. 1.

As illustrated in FIG. 4, the latch control signal generation circuit 12 may include a first command address latch 21 and a second command address latch 22. The first command address latch 21 may be synchronized with a rising edge of the second internal clock signal CLKf to latch the seventh bit CA<7> of the command/address signal CA<1:7> and to output the latched signal of the seventh bit CA<7> of the command/address signal CA<1:7> as a latched command/address signal CAF<7>. The second command address latch 22 may be synchronized with the column address strobe command CAS to latch the latched command/address signal CAF<7> and to output the latched signal of the latched command/address signal CAF<7> as the latch control signal B3LAT. Each of the first and second command address latches 21 and 22 may be realized using a D-flipflop.

Figure 5:
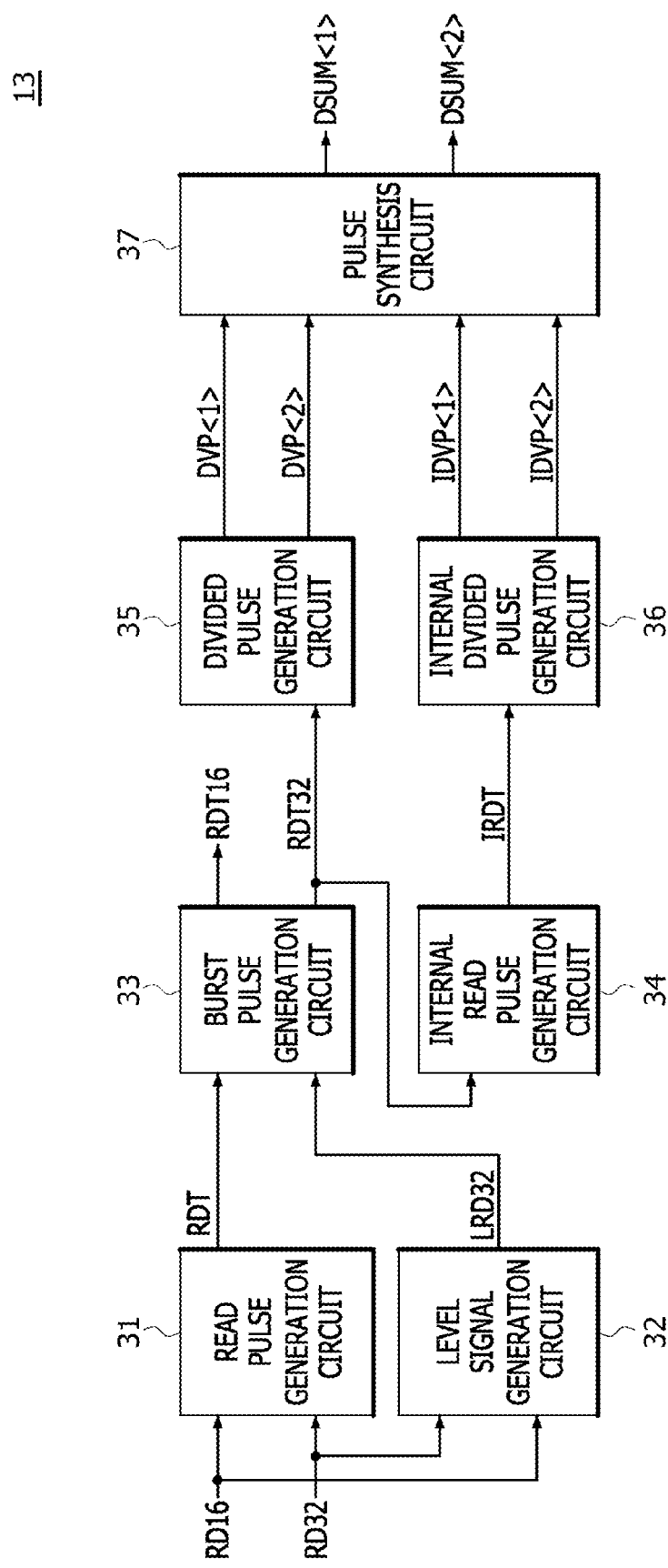
FIG. 5 is a block diagram illustrating an example of a pulse division circuit included in the semiconductor device of FIG. 1.

As illustrated in FIG. 5, the pulse division circuit 13 may include a read pulse generation circuit 31, a level signal generation circuit 32, a burst pulse generation circuit 33, an internal read pulse generation circuit 34, a divided pulse generation circuit 35, an internal divided pulse generation circuit 36, and a pulse synthesis circuit 37.

The read pulse generation circuit 31 may generate a read pulse RDT in response to the first burst mode command RD16 and the second burst mode command RD32. The read pulse generation circuit 31 may create the read pulse RDT whenever the first burst mode command RD16 or the second burst mode command RD32 is generated. A pulse width of the read pulse RDT may be set to be different according to the embodiments. An operation and a configuration of the read pulse generation circuit 31 will be described with reference to FIG. 6 later.

The level signal generation circuit 32 may generate a burst mode level signal LRD32 in response to the first burst mode command RD16 and the second burst mode command RD32. The level signal generation circuit 32 may generate the burst mode level signal LRD32 having a first logic level if the first burst mode command RD16 is generated. The level signal generation circuit 32 may generate the burst mode level signal LRD32 having a second logic level if the second burst mode command RD32 is generated. The level signal generation circuit 32 may generate the burst mode level signal LRD32 having the second logic level after a period in which a burst operation set to have a burst length of '32' is performed elapses from a point of time that the second burst mode command RD32 is generated. In an embodiment, the first logic level may be a logic "low" level and the second logic level may be a logic "high" level. An operation and a configuration of the level signal generation circuit 32 will be described with reference to FIG. 7 later.

The burst pulse generation circuit 33 may generate a first burst pulse RDT16 and a second burst pulse RDT32 from the read pulse RDT in response to the burst mode level signal LRD32. The burst pulse generation circuit 33 may output the read pulse RDT as the first burst pulse RDT16 if the burst mode level signal LRD32 has the first logic level. The burst pulse generation circuit 33 may output the read pulse RDT as the second burst pulse RDT32 if the burst mode level signal LRD32 has the second logic level. The burst pulse generation circuit 33 may output the read pulse RDT created by the first burst mode command RD16 as the first burst pulse RDT16 and may output the read pulse RDT created by the second burst mode command RD32 as the second burst pulse RDT32. An operation and a configuration of the burst pulse generation circuit 33 will be described with reference to FIG. 8 later.

The internal read pulse generation circuit 34 may delay the second burst pulse RDT32 by a period in which a burst operation set to have a burst length of '32' is performed, thereby generating an internal read pulse IRDT. If eight-bit data are outputted for one cycle of the clock signal CLK, the internal read pulse generation circuit 34 may delay the second burst pulse RDT32 by a period corresponding to four cycles of the clock signal CLK to generate the internal read pulse IRDT. An operation and a configuration of the internal read pulse generation circuit 34 will be described with reference to FIG. 9 later.

The divided pulse generation circuit 35 may divide the second burst pulse RDT32 to generate the divided pulses DVP<1:2>. The divided pulse generation circuit 35 may generate the first bit DVP<1> of the divided pulses DVP<1:2> if the second burst pulse RDT32 is firstly created. The divided pulse generation circuit 35 may generate the second bit DVP<2> of the divided pulses DVP<1:2> if the second burst pulse RDT32 is secondly created. An operation and a configuration of the divided pulse generation circuit 35 will be described with reference to FIG. 10 later.

The internal divided pulse generation circuit 36 may divide the internal read pulse IRDT to generate internal divided pulses IDVP<1:2>. The internal divided pulse generation circuit 36 may generate a first bit IDVP<1> of the internal divided pulses IDVP<1:2> if the internal read pulse IRDT is firstly created. The internal divided pulse generation circuit 36 may generate a second bit IDVP<2> of the internal divided pulses IDVP<1:2> if the internal read pulse IRDT is secondly created. An operation and a configuration of the internal divided pulse generation circuit 36 will be described with reference to FIG. 11 later.

The pulse synthesis circuit 37 may synthesize the divided pulses DVP<1:2> and the internal divided pulses IDVP<1:2> to generate the synthesized division pulses DSUM<1:2>. The pulse synthesis circuit 37 may synthesize the first bit DVP<1> of the divided pulses DVP<1:2> and the first bit IDVP<1> of the internal divided pulses IDVP<1:2> to generate the first bit DSUM<1> of the synthesized division pulses DSUM<1:2>. The first bit DSUM<1> of the synthesized division pulses DSUM<1:2> may be generated if the first bit DVP<1> of the divided pulses DVP<1:2> or the first bit IDVP<1> of the internal divided pulses IDVP<1:2> is created. The pulse synthesis circuit 37 may synthesize the second bit DVP<2> of the divided pulses DVP<1:2> and the second bit IDVP<2> of the internal divided pulses IDVP<1:2> to generate the second bit DSUM<2> of the synthesized division pulses DSUM<1:2>. The second bit DSUM<2> of the synthesized division pulses DSUM<1:2> may be generated if the second bit DVP<2> of the divided pulses DVP<1:2> or the second bit IDVP<2> of the internal divided pulses IDVP<1:2> is created. An operation and a configuration of the pulse synthesis circuit 37 will be described with reference to FIG. 12 later.

Figure 6:
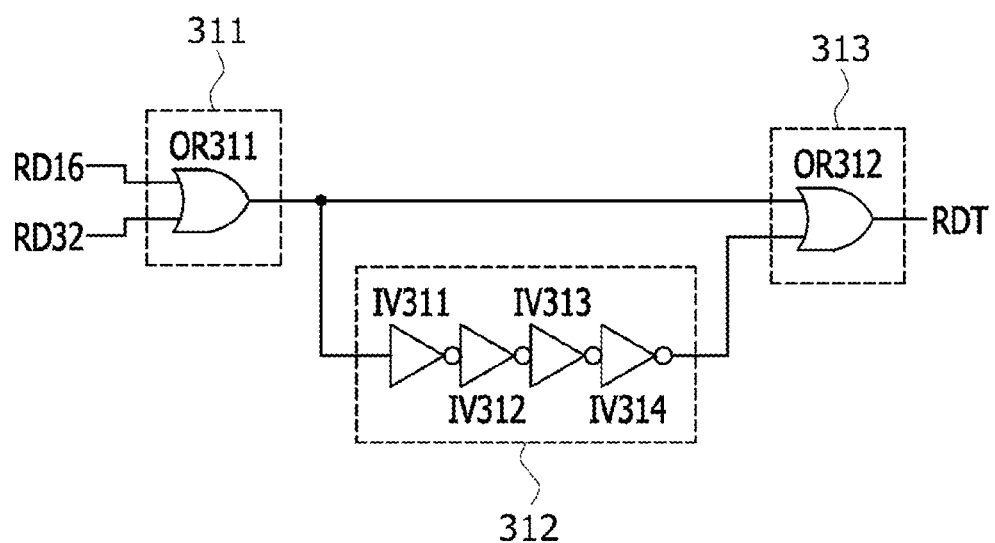
FIG. 6 is a circuit diagram illustrating an example of a read pulse generation circuit included in the pulse division circuit of FIG. 5.

As illustrated in FIG. 6, the read pulse generation circuit 31 may include a command input circuit 311, a command delay circuit 312, and a pulse output circuit 313. The command input circuit 311 may include an OR gate OR311 that performs a logical OR operation of the first burst mode command RD16 and the second burst mode command RD32. The command input circuit 311 may output a signal having a logic "high" level if the first burst mode command RD16 or the second burst mode command RD32 is generated. The command delay circuit 312 may include inverters IV311~IV314 that are cascaded and may delay the output signal of the command input circuit 311 by a delay time which is set by the inverters IV311~IV314 to output the delayed signal of the output signal of the command input circuit 311. The pulse output circuit 313 may include an OR gate OR312 that performs a logical OR operation of an output signal of the command input circuit 311 and an output signal of the command delay circuit 312 to generate the read pulse RDT. As a result, the read pulse generation circuit 31 may generate the read pulse RDT having a pulse width corresponding to a delay time which is set by the inverters IV311~IV314 connected in series whenever the first burst mode command RD16 or the second burst mode command RD32 is generated.

Figure 7:
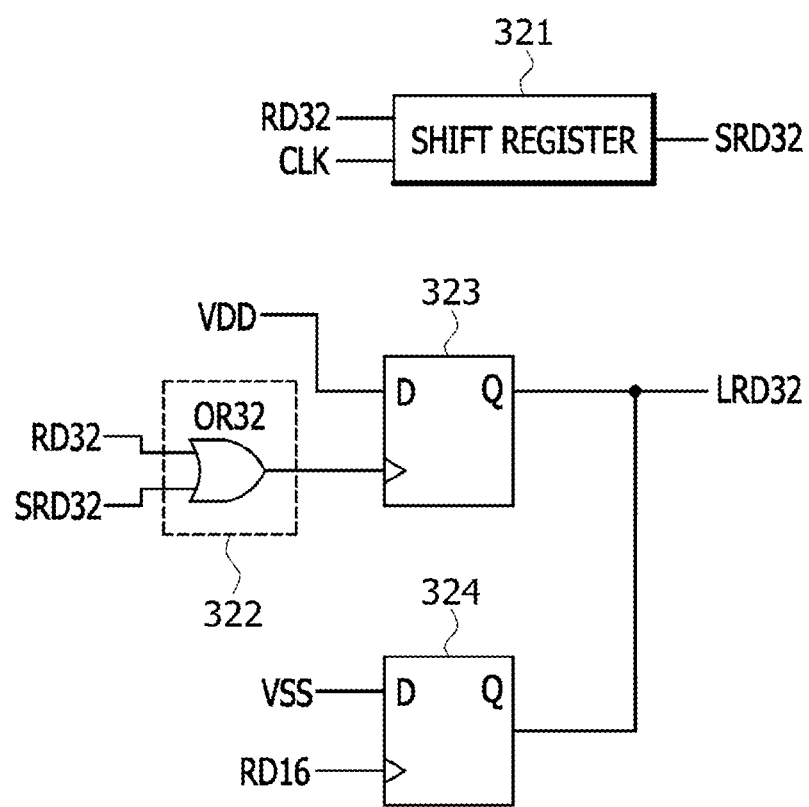
FIG. 7 illustrates an example of a level signal generation circuit included in the pulse division circuit of FIG. 5.

As illustrated in FIG. 7, the level signal generation circuit 32 may include a shift register 321, a command synthesizer 322, a first burst latch 323, and a second burst latch 324. The shift register 321 may shift the second burst mode command RD32 by a period in which a burst operation set to have a burst length of '32' is performed according to the clock signal CLK, thereby generating a shifted burst mode command SRD32. The command synthesizer 322 may include an OR gate OR32 that performs a logical OR operation of the second burst mode command RD32 and the shifted burst mode command SRD32. The command synthesizer 322 may output a signal having a logic "high" level if the second burst mode command RD32 or the shifted burst mode command SRD32 is generated. The first burst latch 323 may latch a power voltage VDD in synchronization with a point of time that an output signal of the command synthesizer 322 changes to a logic "high" level and may output the latched signal of the power voltage VDD as the burst mode level signal LRD32. The second burst latch 324 may latch a ground voltage VSS if the first burst mode command RD16 is generated and may output the latched signal of the ground voltage VSS as the burst mode level signal LRD32. Each of the first and second burst latches 323 and 324 may be realized using a D-flipflop.

As described above, the level signal generation circuit 32 may generate the burst mode level signal LRD32 having a logic "low" level if the first burst mode command RD16 is generated. In addition, the level signal generation circuit 32 may generate the burst mode level signal LRD32 having a logic "high" level if the second burst mode command RD32 is generated. Moreover, the level signal generation circuit 32 may generate the burst mode level signal LRD32 having a logic "high" level after a period in which a burst operation set to have a burst length of '32' is performed elapses from a point of time that the second burst mode command RD32 is generated.

Figure 8:
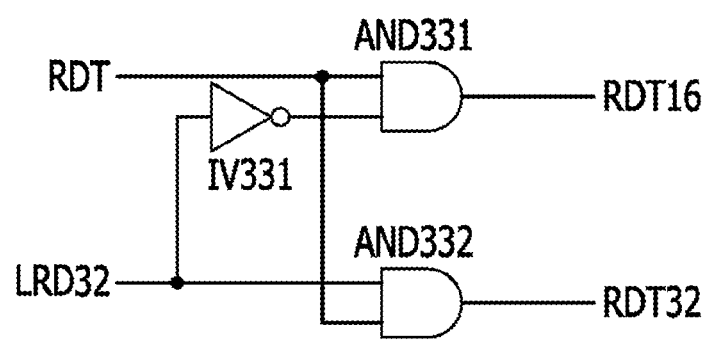
FIG. 8 is a circuit diagram illustrating an example of a burst pulse generation circuit included in the pulse division circuit of FIG. 5.

As illustrated in FIG. 8, the burst pulse generation circuit 33 may include an inverter IV331 and AND gates AND331 and AND332. The inverter IV331 may inversely buffer the burst mode level signal LRD32 to output the inversely buffered signal of the burst mode level signal LRD32. The AND gate AND331 may perform a logical AND operation of the read pulse RDT and an output signal of the inverter IV331 to generate the first burst pulse RDT16. The AND gate AND332 may perform a logical AND operation of the read pulse RDT and the burst mode level signal LRD32 to generate the second burst pulse RDT32. The burst pulse generation circuit 33 may output the read pulse RDT as the first burst pulse RDT16 if the burst mode level signal LRD32 has a logic "low" level. The burst pulse generation circuit 33 may output the read pulse RDT as the second burst pulse RDT32 if the burst mode level signal LRD32 has a logic "high" level. The burst pulse generation circuit 33 may output the read pulse RDT generated by the first burst mode command RD16 as the first burst pulse RDT16 and may output the read pulse RDT generated by the second burst mode command RD32 as the second burst pulse RDT32.

Figure 9:
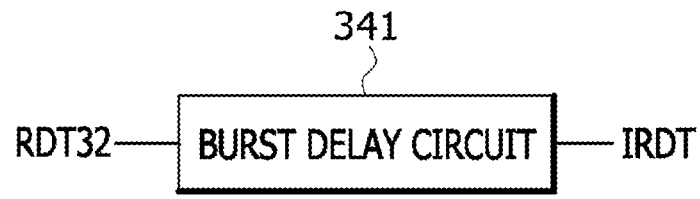
FIG. 9 illustrates an example of an internal read pulse generation circuit included in the pulse division circuit of FIG. 5.

As illustrated in FIG. 9, the internal read pulse generation circuit 34 may include a burst delay circuit 341. The burst delay circuit 341 may delay the second burst pulse RDT32 by a period in which a burst operation set to have a burst length of '32' is performed, thereby generating the internal read pulse IRDT. The burst delay circuit 341 may be realized using a delay circuit such as an inverter chain or a shift register. If eight-bit data are outputted for one cycle of the clock signal CLK, the internal read pulse generation circuit 34 may delay the second burst pulse RDT32 by a period corresponding to four cycles of the clock signal CLK to generate the internal read pulse IRDT.

Figure 10:
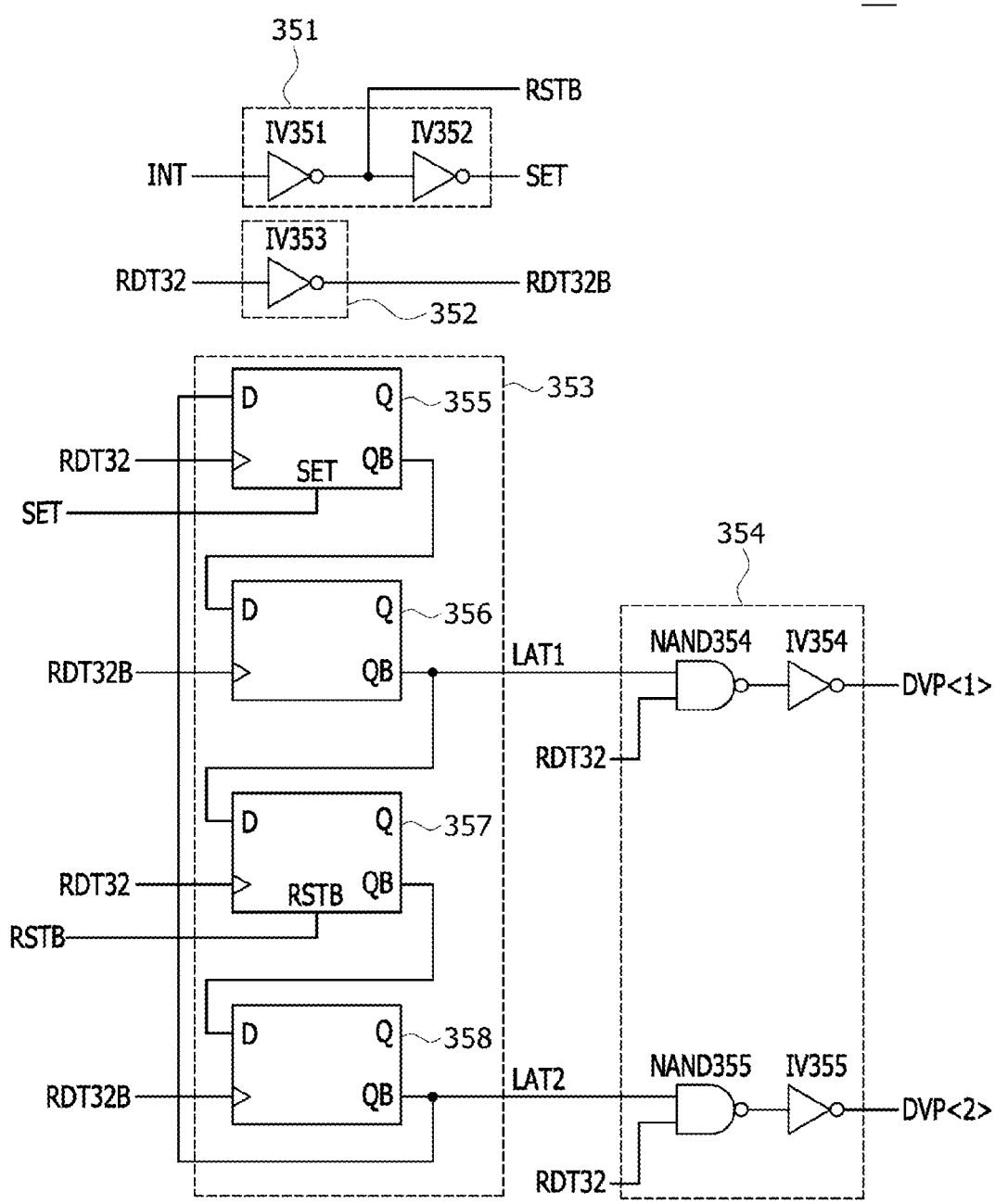
FIG. 10 is a circuit diagram illustrating an example of a divided pulse generation circuit included in the pulse division circuit of FIG. 5.

As illustrated in FIG. 10, the divided pulse generation circuit 35 may include an initialization signal process circuit 351, a burst pulse inversion circuit 352, a latch signal generation circuit 353, and a divided pulse output circuit 354.

The initialization signal process circuit 351 may include inverters IV351 and IV352. The inverter IV351 may inversely buffer an initialization signal INT to generate a reset signal RSTB. The inverter IV352 may inversely buffer the reset signal RSTB to generate a set signal SET. The initialization signal INT may be enabled to have a logic "high" level for an initialization operation of the semiconductor device 1. If the initialization signal INT is enabled to have a logic "high" level to perform the initialization operation, the initialization signal process circuit 351 may generate the reset signal RSTB enabled to have a logic "low" level and the set signal SET enabled to have a logic "high" level.

The burst pulse inversion circuit 352 may include an inverter IV353. The inverter IV353 may inversely buffer the second burst pulse RDT32 to generate an inverted burst pulse RDT32B. The burst pulse inversion circuit 352 may generate the inverted burst pulse RDT32B whose level changes from a logic "low" level into a logic "high" level at a point of time that a level of the second burst pulse RDT32 changes from a logic "high" level into a logic "low" level. That is, a rising edge of the inverted burst pulse RDT32B may occur in synchronization with an end point of the second burst pulse RDT32 (i.e., a falling edge of the second burst pulse RDT32).

The latch signal generation circuit 353 may include a first burst pulse latch 355, a second burst pulse latch 356, a third burst pulse latch 357, and a fourth burst pulse latch 358. The first burst pulse latch 355 may output an inverted output signal QB having a logic "low" level if the set signal SET has a logic "high" level during the initialization operation. The first burst pulse latch 355 may be synchronized with a point of time that the second burst pulse RDT32 is generated, thereby latching a second latch signal LAT2 and inversely buffering the latched signal of the second latch signal LAT2 to output the inversely buffered signal of the latched signal of the second latch signal LAT2 as the inverted output signal QB. The second burst pulse latch 356 may be synchronized with a point of time that the inverted burst pulse RDT32B is generated, thereby latching the inverted output signal QB of the first burst pulse latch 355 and inversely buffer the latched signal of the inverted output signal QB of the first burst pulse latch 355 as a first latch signal LAT1. The third burst pulse latch 357 may output an inverted output signal QB having a logic "high" level if the reset signal RSTB has a logic "low" level during the initialization operation. The third burst pulse latch 357 may be synchronized with a point of time that the second burst pulse RDT32 is generated, thereby latching the first latch signal LAT1 and inversely buffering the latched signal of the first latch signal LAT1 to output the inversely buffered signal of the latched signal of the first latch signal LAT1 as the inverted output signal QB of the third burst pulse latch 357. The fourth burst pulse latch 358 may be synchronized with a point of time that the inverted burst pulse RDT32B is generated, thereby latching the inverted output signal QB of the third burst pulse latch 357 and inversely buffer the latched signal of the inverted output signal QB of the third burst pulse latch 357 as the second latch signal LAT2. As a result, the latch signal generation circuit 353 may generate the first latch signal LAT1 set to have a logic "high" level and the second latch signal LAT2 set to have a logic "low" level in the initialization operation. The latch signal generation circuit 353 may generate the first latch signal LAT1 set to have a logic "low" level and the second latch signal LAT2 set to have a logic "high" level after the second burst pulse RDT32 is firstly generated. The latch signal generation circuit 353 may generate the first latch signal LAT1 set to have a logic "high" level and the second latch signal LAT2 set to have a logic "low" level after the second burst pulse RDT32 is secondly generated. Each of the first to fourth burst pulse latches 355, 356, 357, and 358 may be realized using a D-flipflop.

The divided pulse output circuit 354 may include NAND gates NAND354 and NAND355 as well as inverters IV354 and IV355. The NAND gate NAND354 may receive the first latch signal LAT1 and the second burst pulse RDT32 and may perform a logical NAND operation of the first latch signal LAT1 and the second burst pulse RDT32. The inverter IV354 may inversely buffer an output signal of the NAND gate NAND354 to output the inversely buffered signal of the output signal of the NAND gate NAND354 as the first bit DVP<1> of the divided pulses DVP<1:2>. The NAND gate NAND355 may receive the second latch signal LAT2 and the second burst pulse RDT32 and may perform a logical NAND operation of the second latch signal LAT2 and the second burst pulse RDT32. The inverter IV355 may inversely buffer an output signal of the NAND gate NAND355 to output the inversely buffered signal of the output signal of the NAND gate NAND355 as the second bit DVP<2> of the divided pulses DVP<1:2>. That is, the divided pulse output circuit 354 may buffer the first latch signal LAT1 set to have a logic "high" level in the initialization operation to output the buffered signal of the first latch signal LAT1 as the first bit DVP<1> of the divided pulses DVP<1:2> if the second burst pulse RDT32 is firstly generated. The divided pulse output circuit 354 may buffer the second latch signal LAT2 having a logic "high" level to output the buffered signal of the second latch signal LAT2 as the second bit DVP<2> of the divided pulses DVP<1:2> if the second burst pulse RDT32 is secondly generated after the second burst pulse RDT32 is firstly generated.

As described above, the divided pulse generation circuit 35 may generate the first bit DVP<1> of the divided pulses DVP<1:2> if the second burst pulse RDT32 is firstly generated (i.e., when the second burst pulse RDT32 is first generated). The divided pulse generation circuit 35 may generate the second bit DVP<2> of the divided pulses DVP<1:2> if the second burst pulse RDT32 is secondly generated (i.e., when the second burst pulse RDT32 is generated a second time).

Figure 11:
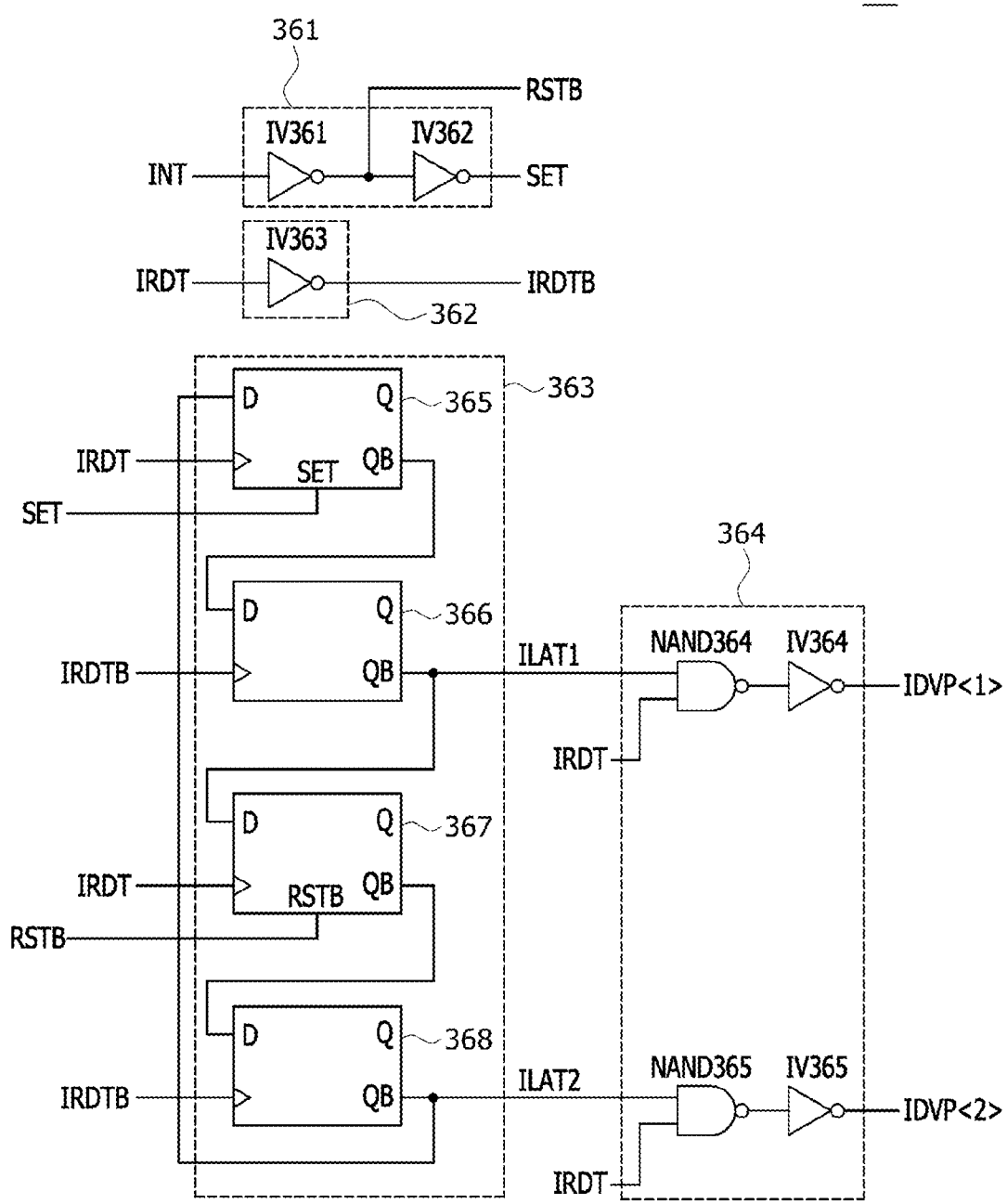
FIG. 11 is a circuit diagram illustrating an example of an internal divided pulse generation circuit included in the pulse division circuit of FIG. 5.

As illustrated in FIG. 11, the internal divided pulse generation circuit 36 may include an internal initialization signal process circuit 361, an internal burst pulse inversion circuit 362, an internal latch signal generation circuit 363, and an internal divided pulse output circuit 364.

The internal initialization signal process circuit 361 may include inverters IV361 and IV362. The inverter IV361 may inversely buffer the initialization signal INT to generate the reset signal RSTB. The inverter IV362 may inversely buffer the reset signal RSTB to generate the set signal SET. The initialization signal INT may be enabled to have a logic "high" level for the initialization operation of the semiconductor device 1. If the initialization signal INT is enabled to have a logic "high" level to perform the initialization operation, the initialization signal process circuit 361 may generate the reset signal RSTB enabled to have a logic "low" level and the set signal SET enabled to have a logic "high" level.

The internal burst pulse inversion circuit 362 may include an inverter IV363. The inverter IV363 may inversely buffer the internal read pulse IRDT to generate an inverted internal read pulse IRDTB. The internal burst pulse inversion circuit 362 may generate the inverted internal read pulse IRDTB whose level changes from a logic "low" level into a logic "high" level at a point of time that a level of the internal read pulse IRDT changes from a logic "high" level into a logic "low" level. That is, a rising edge of the inverted internal read pulse IRDTB may occur in synchronization with an end point of the internal read pulse IRDT (i.e., a falling edge of the internal read pulse IRDT).

The internal latch signal generation circuit 363 may include a first internal burst pulse latch 365, a second internal burst pulse latch 366, a third internal burst pulse latch 367, and a fourth internal burst pulse latch 368. The first internal burst pulse latch 365 may output an inverted output signal QB having a logic "low" level if the set signal SET has a logic "high" level during the initialization operation. The first internal burst pulse latch 365 may be synchronized with a point of time that the internal read pulse IRDT is generated, thereby latching a second internal latch signal ILAT2 and inversely buffering the latched signal of the second internal latch signal ILAT2 to output the inversely buffered signal of the latched signal of the second internal latch signal ILAT2 as the inverted output signal QB of the first internal burst pulse latch 365. The second internal burst pulse latch 366 may be synchronized with a point of time that the inverted internal read pulse IRDTB is generated, thereby latching the inverted output signal QB of the first internal burst pulse latch 365 and inversely buffer the latched signal of the inverted output signal QB of the first burst pulse latch 355 as a first internal latch signal ILAT1. The third internal burst pulse latch 367 may output an inverted output signal QB having a logic "high" level if the reset signal RSTB has a logic "low" level during the initialization operation. The third internal burst pulse latch 367 may be synchronized with a point of time that the internal read pulse IRDT is generated, thereby latching the first internal latch signal ILAT1 and inversely buffering the latched signal of the first internal latch signal ILAT1 to output the inversely buffered signal of the latched signal of the first internal latch signal ILAT1 as the inverted output signal QB of the third internal burst pulse latch 367. The fourth internal burst pulse latch 368 may be synchronized with a point of time that the inverted internal read pulse IRDTB is generated, thereby latching the inverted output signal QB of the third internal burst pulse latch 367 and inversely buffer the latched signal of the inverted output signal QB of the third internal burst pulse latch 367 as the second internal latch signal ILAT2. As a result, the internal latch signal generation circuit 363 may generate the first internal latch signal ILAT1 set to have a logic "high" level and the second internal latch signal ILAT2 set to have a logic "low" level in the initialization operation. The internal latch signal generation circuit 363 may generate the first internal latch signal ILAT1 set to have a logic "low" level and the second internal latch signal ILAT2 set to have a logic "high" level after the internal read pulse IRDT is firstly generated. The internal latch signal generation circuit 363 may generate the first internal latch signal ILAT1 set to have a logic "high" level and the second internal latch signal ILAT2 set to have a logic "low" level after the internal read pulse IRDT is secondly generated. Each of the first to fourth internal burst pulse latches 365, 366, 367, and 368 may be realized using a D-flipflop.

The internal divided pulse output circuit 364 may include NAND gates NAND364 and NAND365 as well as inverters IV364 and IV365. The NAND gate NAND364 may receive the first internal latch signal ILAT1 and the internal read pulse IRDT and may perform a logical NAND operation of the first internal latch signal ILAT1 and the internal read pulse IRDT. The inverter IV364 may inversely buffer an output signal of the NAND gate NAND364 to output the inversely buffered signal of the output signal of the NAND gate NAND364 as the first bit IDVP<1> of the internal divided pulses IDVP<1:2>. The NAND gate NAND365 may receive the second internal latch signal ILAT2 and the internal read pulse IRDT and may perform a logical NAND operation of the second internal latch signal ILAT2 and the internal read pulse IRDT. The inverter IV365 may inversely buffer an output signal of the NAND gate NAND365 to output the inversely buffered signal of the output signal of the NAND gate NAND365 as the second bit IDVP<2> of the internal divided pulses IDVP<1:2>. That is, the internal divided pulse output circuit 364 may buffer the first internal latch signal ILAT1 set to have a logic "high" level in the initialization operation to output the buffered signal of the first internal latch signal ILAT1 as the first bit IDVP<1> of the internal divided pulses IDVP<1:2> if the internal read pulse IRDT is firstly generated. The internal divided pulse output circuit 364 may buffer the second internal latch signal ILAT2 having a logic "high" level to output the buffered signal of the second internal latch signal ILAT2 as the second bit IDVP<2> of the internal divided pulses IDVP<1:2> if the internal read pulse IRDT is secondly generated after the internal read pulse IRDT is firstly generated.

As described above, the internal divided pulse generation circuit 36 may generate the first bit IDVP<1> of the internal divided pulses IDVP<1:2> if the internal read pulse IRDT is firstly generated (i.e., when the internal read pulse IRDT is first generated). The internal divided pulse generation circuit 36 may generate the second bit IDVP<2> of the internal divided pulses IDVP<1:2> if the internal read pulse IRDT is secondly generated (i.e., when the internal read pulse IRDT is generated a second time).

Figure 12:
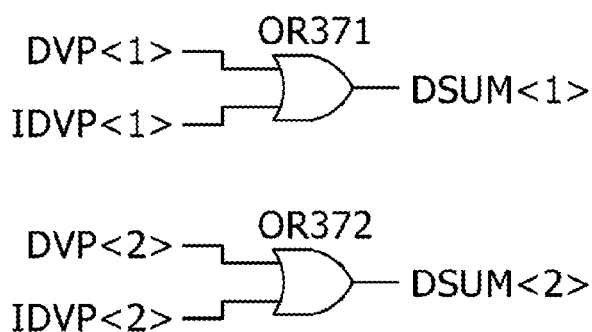
FIG. 12 is a circuit diagram illustrating an example of a pulse synthesis circuit included in the pulse division circuit of FIG. 5.

As illustrated in FIG. 12, the pulse synthesis circuit 37 may include OR gates OR371 and OR372. The OR gate OR371 may perform a logical OR operation of the first bit DVP<1> of the divided pulses DVP<1:2> and the first bit IDVP<1> of the internal divided pulses IDVP<1:2> to generate the first bit DSUM<1> of the synthesized division pulses DSUM<1:2>. The OR gate OR372 may perform a logical OR operation of the second bit DVP<2> of the divided pulses DVP<1:2> and the second bit IDVP<2> of the internal divided pulses IDVP<1:2> to generate the second bit DSUM<2> of the synthesized division pulses DSUM<1:2>. That is, the pulse synthesis circuit 37 may generate the first bit DSUM<1> of the synthesized division pulses DSUM<1:2> if the first bit DVP<1> of the divided pulses DVP<1:2> or the first bit IDVP<1> of the internal divided pulses IDVP<1:2> is generated. In addition, the pulse synthesis circuit 37 may generate the second bit DSUM<2> of the synthesized division pulses DSUM<1:2> if the second bit DVP<2> of the divided pulses DVP<1:2> or the second bit IDVP<2> of the internal divided pulses IDVP<1:2> is generated.

Figure 13:
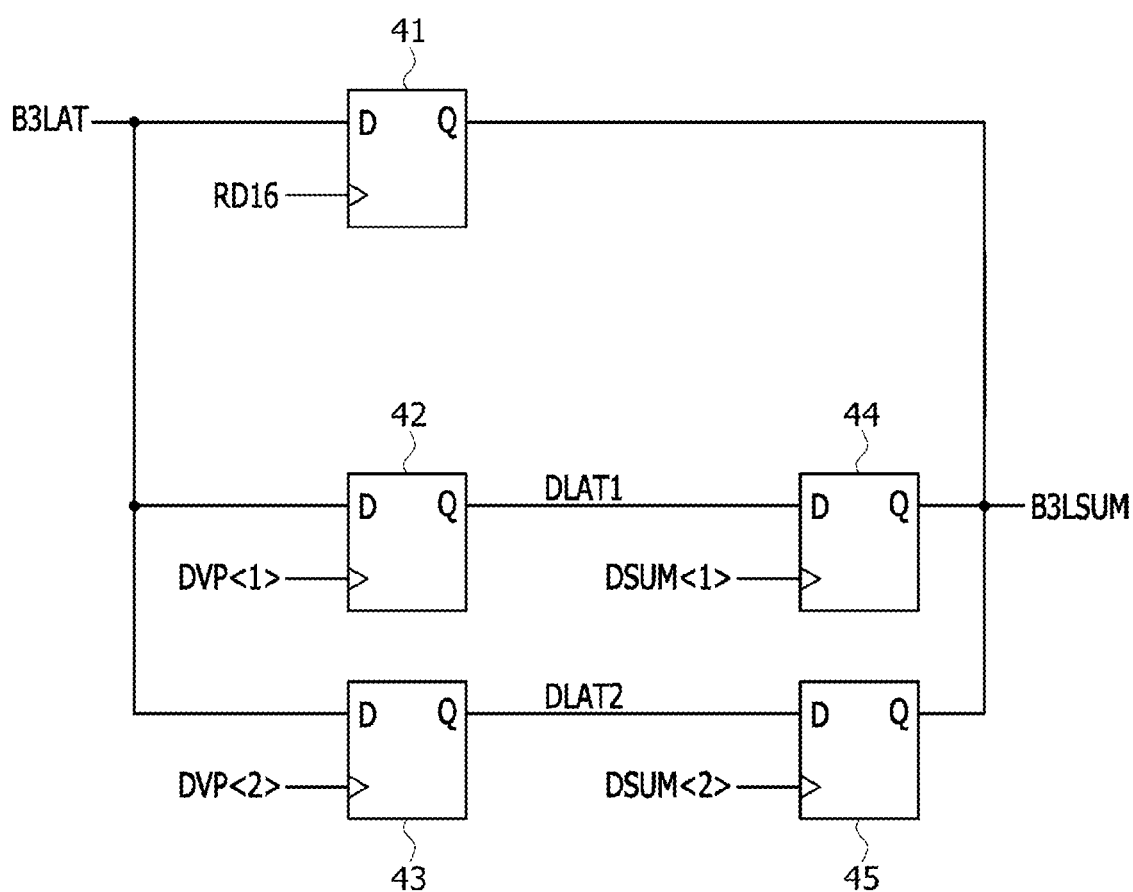
FIG. 13 is a circuit diagram illustrating an example of a synthesis control signal generation circuit included in the semiconductor device of FIG. 1.

As illustrated in FIG. 13, the synthesis control signal generation circuit 14 may include a first control signal latch 41, a second control signal latch 42, a third control signal latch 43, a fourth control signal latch 44, and a fifth control signal latch 45. The first control signal latch 41 may latch the latch control signal B3LAT to output the latched signal of the latch control signal B3LAT as the synthesis control signal B3LSUM if the first burst mode command RD16 is generated. The second control signal latch 42 may latch the latch control signal B3LAT in synchronization with the first bit DVP<1> of the divided pulses DVP<1:2> to generate a first division latch signal DLAT1. The third control signal latch 43 may latch the latch control signal B3LAT in synchronization with the second bit DVP<2> of the divided pulses DVP<1:2> to generate a second division latch signal DLAT2. The fourth control signal latch 44 may be synchronized with the first bit DSUM<1> of the synthesized division pulses DSUM<1:2> to latch the first division latch signal DLAT1 and to output the latched signal of the first division latch signal DLAT1 as the synthesis control signal B3LSUM. The fifth control signal latch 45 may be synchronized with the second bit DSUM<2> of the synthesized division pulses DSUM<1:2> to latch the second division latch signal DLAT2 and to output the latched signal of the second division latch signal DLAT2 as the synthesis control signal B3LSUM. Each of the first to fifth control signal latches 41, 42, 43, 44, and 45 may be realized using a D-flipflop.

Figure 14:
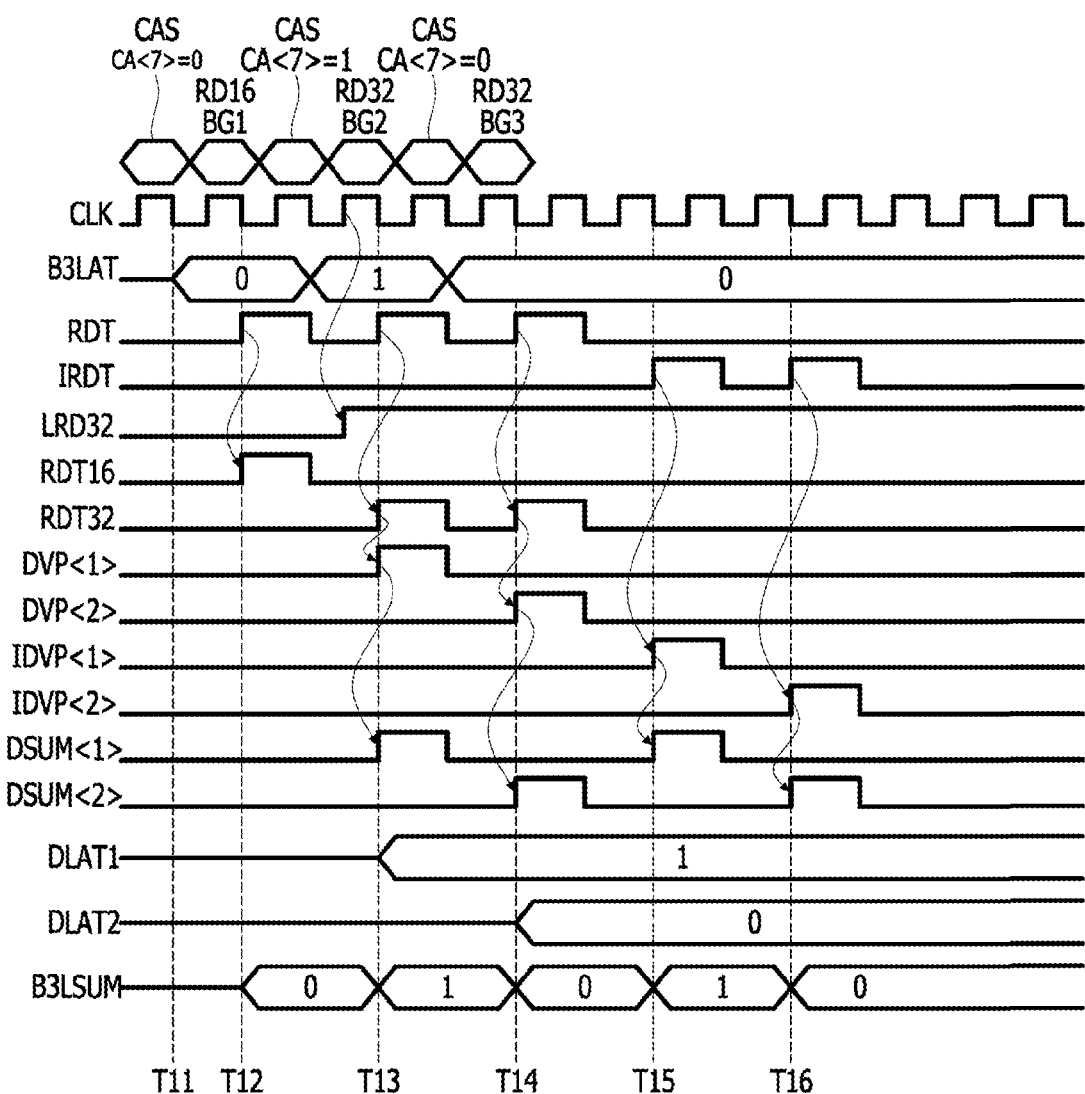
FIGS. 14 to 17 are timing diagrams illustrating operations of the semiconductor device shown in FIG. 1.
Figure 15:
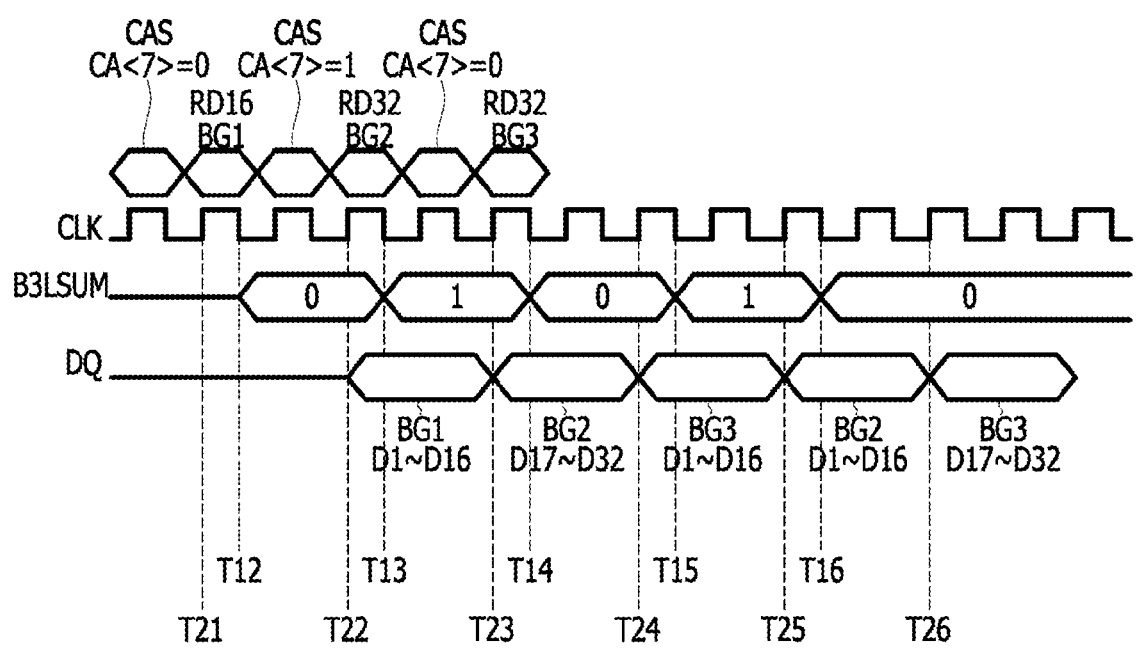

Operations of the semiconductor device having the aforementioned configuration will be described hereinafter with reference to FIGS. 14 to 17. Referring to FIGS. 14 and 15, a burst sequence of the internal data DQ is illustrated in the cases of read operations for outputting 16-bit data stored in a first bank group selected by the first bank group address BG1 while the latch control signal B3LAT is set to have a logic "low" level, for outputting 32-bit data stored in a second bank group selected by the second bank group address BG2 while the latch control signal B3LAT is set to have a logic "high" level, and for outputting 32-bit data stored in a third bank group selected by the third bank group address BG3 while the latch control signal B3LAT is set to have a logic "low" level.

As illustrated in FIG. 14, while the column address strobe command CAS is generated, the seventh bit CA<7> of the command/address signal CA<1:7> may be latched to generate the latch control signal B3LAT. At a point of time "T11", the latch control signal B3LAT may be generated to have a logic "low" level because the seventh bit CA<7> of the command/address signal CA<1:7> has a logic "low" level while the column address strobe command CAS is firstly generated. A logic "low" level of the latch control signal B3LAT may be indicated by zero (0). Since the seventh bit CA<7> of the command/address signal CA<1:7> has a logic "high" level while the column address strobe command CAS is secondly generated, the latch control signal B3LAT may be generated to have a logic "high" level. A logic "high" level of the latch control signal B3LAT may be indicated by one (1). Since the seventh bit CA<7> of the command/address signal CA<1:7> has a logic "low" level while the column address strobe command CAS is thirdly generated, the latch control signal B3LAT may be generated to have a logic "low" level.

As illustrated in FIG. 14, if the first burst mode command RD16 for the first bank group selected by the first bank group address BG1 is generated, the read pulse RDT may be generated at a point of time "T12" to perform a burst operation for outputting 16-bit data stored in the first bank group. If the second burst mode command RD32 for the second bank group selected by the second bank group address BG2 is generated, the read pulse RDT may be generated at a point of time "T13" to perform a burst operation for outputting 32-bit data stored in the second bank group. If the second burst mode command RD32 for the second bank group is generated, a level of the burst mode level signal LRD32 may change from a logic "low" level into a logic "high" level. If the second burst mode command RD32 for the third bank group selected by the third bank group address BG3 is generated, the read pulse RDT may be generated at a point of time "T14" to perform a burst operation for outputting 32-bit data stored in the third bank group.

As illustrated in FIG. 14, the read pulse RDT may be outputted as the first burst pulse RDT16 during a period that the burst mode level signal LRD32 has a logic "low" level. During a period that the burst mode level signal LRD32 has a logic "high" level, the read pulse RDT may be outputted as the second burst pulse RDT32. The second burst pulse RDT32 may be delayed by a period in which a burst operation set to have a burst length of '32' is performed, and the delayed pulse of the second burst pulse RDT32 may be outputted as the internal read pulse IRDT. In an embodiment, if 8-bit data are outputted for one cycle of the clock signal CLK, the internal read pulse generation circuit 34 may delay the second burst pulse RDT32 by four cycles of the clock signal CLK to generate the internal read pulse IRDT. Since the second burst pulse RDT32 is generated at the points of time "T13" and "T14", the internal read pulse IRDT may be generated at a point of time "T15" that four cycles of the clock signal CLK has elapsed from the point of time "T13" and at a point of time "T16" that four cycles of the clock signal CLK has elapsed from the point of time "T14".

As illustrated in FIG. 14, the second burst pulse RDT32 may be divided to provide the divided pulses DVP<1:2>. The second burst pulse RDT32 generated at the point of time "T13" may be outputted as the first bit DVP<1> of the divided pulses DVP<1:2>. The second burst pulse RDT32 generated at the point of time "T14" may be outputted as the second bit DVP<2> of the divided pulses DVP<1:2>. The internal read pulse IRDT may be divided to provide the internal divided pulses IDVP<1:2>. The internal read pulse IRDT generated at the point of time "T15" may be outputted as the first bit IDVP<1> of the internal divided pulses IDVP<1:2>. The internal read pulse IRDT generated at the point of time "T16" may be outputted as the second bit IDVP<2> of the internal divided pulses IDVP<1:2>. Since the first bit DSUM<1> of the synthesized division pulses DSUM<1:2> is provided by synthesizing the first bit DVP<1> of the divided pulses DVP<1:2> and the first bit IDVP<1> of the internal divided pulses IDVP<1:2>, the first bit DSUM<1> of the synthesized division pulses DSUM<1: 2> may be generated at the point of time "T13" and the point of time "T15". Since the second bit DSUM<2> of the synthesized division pulses DSUM<1:2> is provided by synthesizing the second bit DVP<2> of the divided pulses DVP<1:2> and the second bit IDVP<2> of the internal divided pulses IDVP<1:2>, the second bit DSUM<2> of the synthesized division pulses DSUM<1:2> may be generated at the point of time "T14" and the point of time "T16".

As illustrated in FIG. 14, the latch control signal B3LAT may be latched in synchronization with the first bit DVP<1> of the divided pulses DVP<1:2> to provide the first division latch signal DLAT1. At the point of time "T13", the first division latch signal DLAT1 may be set to have a logic "high" level. The latch control signal B3LAT may be latched in synchronization with the second bit DVP<2> of the divided pulses DVP<1:2> to provide the second division latch signal DLAT2. At the point of time "T14", the second division latch signal DLAT2 may be set to have a logic "low" level. The latch control signal B3LAT may be latched in synchronization with the first burst pulse RDT16 to provide the synthesis control signal B3LSUM. At the point of time "T12", the synthesis control signal B3LSUM may be set to have a logic "low" level. The first division latch signal DLAT1 may be latched in synchronization with the first bit DSUM<1> of the synthesized division pulses DSUM<1:2> to provide the synthesis control signal B3LSUM. At the points of time "T13" and "T15", the synthesis control signal B3LSUM may be set to have a logic "high" level. The second division latch signal DLAT2 may be latched in synchronization with the second bit DSUM<2> of the synthesized division pulses DSUM<1:2> to provide the synthesis control signal B3LSUM. At the points of time "T14" and "T16", the synthesis control signal B3LSUM may be set to have a logic "low" level.

An operation of generating the internal data DQ will be described hereinafter with reference to FIG. 15. In such a case, it may be assumed that a write latency is set to be 'two' and the synthesis control signal B3LSUM is set to have a logic "low" level during a period between the points of time "T12" and "T13", to have a logic "high" level during a period between the points of time "T13" and "T14", to have a logic "low" level during a period between the points of time "T14" and "T15", to have a logic "high" level during a period between the points of time "T15" and "T16", and to have a logic "low" level after the point of time "T16" (see FIG. 14).

As illustrated in FIG. 15, first group data D1~D16 stored in a first bank group selected by the first bank group address BG1 may be outputted as the internal data DQ at a point of time "T22" that a period (corresponding to two cycles of the clock signal CLK) set by the write latency elapses from a point of time "T21" that the first burst mode command RD16 is generated to perform a read operation for outputting 16-bit data stored in the first bank group selected by the first bank group address BG1.

As illustrated in FIG. 15, second group data D17~D32 stored in a second bank group selected by the second bank group address BG2 may be outputted as the internal data DQ at a point of time "T23" that a period (corresponding to two cycles of the clock signal CLK) set by the write latency elapses from the point of time "T22" that the second burst mode command RD32 is generated to perform a read operation for outputting 32-bit data stored in the second bank group selected by the second bank group address BG2. The operation for outputting the second group data D17~D32 stored in the second bank group as the internal data DQ may terminate at a point of time "T24", and first group data D1~D16 stored in the second bank group may be outputted as the internal data DQ at a point of time "T25" that a bubble period elapses from the point of time "T24". The bubble period may be set to be a time period (corresponding to two cycles of the clock signal CLK) in which a burst operation for outputting 16-bit data is performed. Since the synthesis control signal B3LSUM has a logic "high" level at the points of time "T23" and "T25", a read operation having a burst sequence in which the first group data D1~D16 stored in the second bank group are outputted after the second group data D17~D32 stored in the second bank group are outputted may be performed.

As illustrated in FIG. 15, first group data D1~D16 stored in a third bank group selected by the third bank group address BG3 may be outputted as the internal data DQ at the point of time "T24" that a period (corresponding to two cycles of the clock signal CLK) set by the write latency elapses from the point of time "T23" that the second burst mode command RD32 is generated to perform a read operation for outputting 32-bit data stored in the third bank group selected by the third bank group address BG3. The operation for outputting the first group data D1~D16 stored in the third bank group as the internal data DQ may terminate at the point of time "T25", and second group data D17~D32 stored in the third bank group may be outputted as the internal data DQ at a point of time "T26" that the bubble period terminates after the point of time "T25". Since the synthesis control signal B3LSUM has a logic "low" level at the points of time "T24" and "T26", a read operation having a burst sequence in which the second group data D17~D32 stored in the third bank group are outputted after the first group data D1~D16 stored in the third bank group are outputted may be performed.

Figure 16:
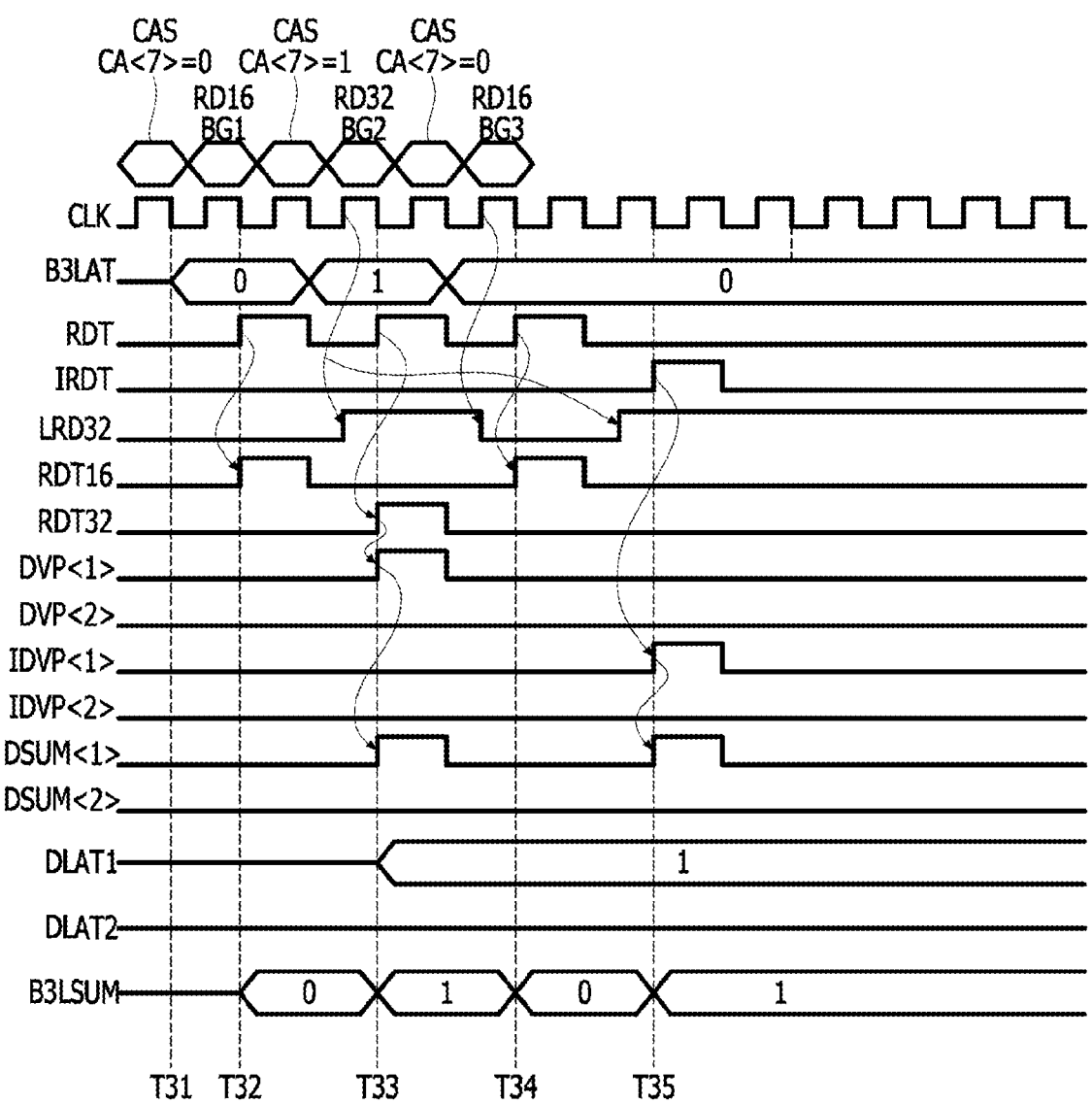
Figure 17:
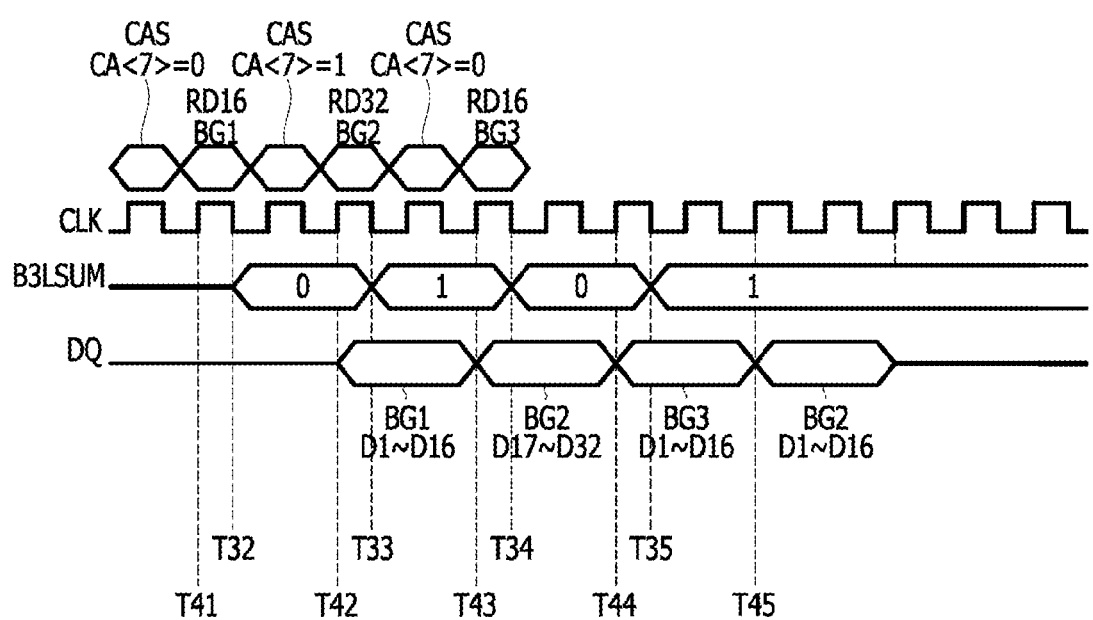

Referring to FIGS. 16 and 17, a burst sequence of the internal data DQ is illustrated in the cases of read operations for outputting 16-bit data stored in a first bank group selected by the first bank group address BG1 while the latch control signal B3LAT is set to have a logic "low" level, for outputting 32-bit data stored in a second bank group selected by the second bank group address BG2 while the latch control signal B3LAT is set to have a logic "high" level, and for outputting 16-bit data stored in a third bank group selected by the third bank group address BG3 while the latch control signal B3LAT is set to have a logic "low" level.

As illustrated in FIG. 16, while the column address strobe command CAS is generated, the seventh bit CA<7> of the command/address signal CA<1:7> may be latched to generate the latch control signal B3LAT. At a point of time "T31", the latch control signal B3LAT may be generated to have a logic "low" level because the seventh bit CA<7> of the command/address signal CA<1:7> has a logic "low" level while the column address strobe command CAS is firstly generated. Since the seventh bit CA<7> of the command/address signal CA<1:7> has a logic "high" level while the column address strobe command CAS is secondly generated, the latch control signal B3LAT may be generated to have a logic "high" level. Since the seventh bit CA<7> of the command/address signal CA<1:7> has a logic "low" level while the column address strobe command CAS is thirdly generated, the latch control signal B3LAT may be generated to have a logic "low" level.

As illustrated in FIG. 16, if the first burst mode command RD16 for the first bank group selected by the first bank group address BG1 is generated, the read pulse RDT may be generated at a point of time "T32" to perform a burst operation for outputting 16-bit data stored in the first bank group. If the second burst mode command RD32 for the second bank group selected by the second bank group address BG2 is generated, the read pulse RDT may be generated at a point of time "T33" to perform a burst operation for outputting 32-bit data stored in the second bank group. If the second burst mode command RD32 for the second bank group is generated, a level of the burst mode level signal LRD32 may change from a logic "low" level into a logic "high" level. If the first burst mode command RD16 for the third bank group selected by the third bank group address BG3 is generated, the read pulse RDT may be generated at a point of time "T34" to perform a burst operation for outputting 16-bit data stored in the third bank group. If the first burst mode command RD16 for the third bank group is generated, a level of the burst mode level signal LRD32 may change from a logic "high" level into a logic "low" level. A level of the burst mode level signal LRD32 may change from a logic "low" level into a logic "high" level at a point of time that a period in which a burst operation set to have a burst length of '32' is performed elapses from a point of time that the second burst mode command RD32 for the second bank group is generated.

As illustrated in FIG. 16, the read pulse RDT may be outputted as the first burst pulse RDT16 during a period that the burst mode level signal LRD32 has a logic "low" level. During a period that the burst mode level signal LRD32 has a logic "high" level, the read pulse RDT may be outputted as the second burst pulse RDT32. The second burst pulse RDT32 may be delayed by a period in which a burst operation set to have a burst length of '32' is performed, and the delayed pulse of the second burst pulse RDT32 may be outputted as the internal read pulse IRDT. In an embodiment, if 8-bit data are outputted for one cycle of the clock signal CLK, the internal read pulse generation circuit 34 may delay the second burst pulse RDT32 by four cycles of the clock signal CLK to generate the internal read pulse IRDT. Since the second burst pulse RDT32 is generated at the point of time "T33", the internal read pulse IRDT may be generated at a point of time "T35" that four cycles of the clock signal CLK has elapsed from the point of time "T33".

As illustrated in FIG. 16, the second burst pulse RDT32 may be divided to provide the divided pulses DVP<1:2>. The second burst pulse RDT32 generated at the point of time "T33" may be outputted as the first bit DVP<1> of the divided pulses DVP<1:2>. The internal read pulse IRDT may be divided to provide the internal divided pulses IDVP<1:2>. The internal read pulse IRDT generated at the point of time "T35" may be outputted as the first bit IDVP<1> of the internal divided pulses IDVP<1:2>. Since the first bit DSUM<1> of the synthesized division pulses DSUM<1:2> is provided by synthesizing the first bit DVP<1> of the divided pulses DVP<1:2> and the first bit IDVP<1> of the internal divided pulses IDVP<1:2>, the first bit DSUM<1> of the synthesized division pulses DSUM<1:2> may be generated at the point of time "T33" and the point of time "T35".

As illustrated in FIG. 16, the latch control signal B3LAT may be latched in synchronization with the first bit DVP<1> of the divided pulses DVP<1:2> to provide the first division latch signal DLAT1. At the point of time "T33", the first division latch signal DLAT1 may be set to have a logic "high" level. The latch control signal B3LAT may be latched in synchronization with the first burst pulse RDT16 to provide the synthesis control signal B3LSUM. At the points of time "T32" and "T34", the synthesis control signal B3LSUM may be set to have a logic "low" level. The first division latch signal DLAT1 may be latched in synchronization with the first bit DSUM<1> of the synthesized division pulses DSUM<1:2> to provide the synthesis control signal B3LSUM. At the points of time "T33" and "T35", the synthesis control signal B3LSUM may be set to have a logic "high" level.

An operation of generating the internal data DQ will be described hereinafter with reference to FIG. 17. In such a case, it may be assumed that a write latency is set to be 'two' and the synthesis control signal B3LSUM is set to have a logic "low" level during a period between the points of time "T32" and "T33", to have a logic "high" level during a period between the points of time "T33" and "T34", to have a logic "low" level during a period between the points of time "T34" and "T35", and to have a logic "high" level after the point of time "T35" (see FIG. 16).

As illustrated in FIG. 17, first group data D1~D16 stored in a first bank group selected by the first bank group address BG1 may be outputted as the internal data DQ at a point of time "T42" that a period (corresponding to two cycles of the clock signal CLK) set by the write latency elapses from a point of time "T41" that the first burst mode command RD16 is generated to perform a read operation for outputting 16-bit data stored in the first bank group selected by the first bank group address BG1.

As illustrated in FIG. 17, second group data D17~D32 stored in a second bank group selected by the second bank group address BG2 may be outputted as the internal data DQ at a point of time "T43" that a period (corresponding to two cycles of the clock signal CLK) set by the write latency elapses from the point of time "T42" that the second burst mode command RD32 is generated to perform a read operation for outputting 32-bit data stored in the second bank group selected by the second bank group address BG2. The operation for outputting the second group data D17~D32 stored in the second bank group as the internal data DQ may terminate at a point of time "T44", and first group data D1~D16 stored in the second bank group may be outputted as the internal data DQ at a point of time "T45" that a bubble period elapses from the point of time "T44". The bubble period may be set to be a time period (corresponding to two cycles of the clock signal CLK) in which a burst operation for outputting 16-bit data is performed. Since the synthesis control signal B3LSUM has a logic "high" level at the points of time "T43" and "T45", a read operation having a burst sequence in which the first group data D1~D16 stored in the second bank group are outputted after the second group data D17~D32 stored in the second bank group are outputted may be performed.

As illustrated in FIG. 17, first group data D1~D16 stored in a third bank group selected by the third bank group address BG3 may be outputted as the internal data DQ at the point of time "T44" that a period (corresponding to two cycles of the clock signal CLK) set by the write latency elapses from the point of time "T43" that the first burst mode command RD16 is generated to perform a read operation for outputting 16-bit data stored in the third bank group selected by the third bank group address BG3.

As described above, a semiconductor device according to an embodiment may latch a control signal before and after a bubble period to output 16-bit data according to the same burst sequence before and after the bubble period if a second burst mode command (corresponding to the second burst mode command RD32) is generated to perform a read operation for outputting 32-bit data from a selected bank group. For example, when the second burst mode command RD32 is generated, the synthesis control signal B3LSUM may be set to have the same logic level before and after the bubble period to accordingly have the same burst sequence before and after the bubble period. Although the above embodiments are described in conjunction with a read operation in which 16-bit data are outputted and a read operation in which 32-bit data are outputted before and after a bubble period, the present disclosure is not limited thereto. For example, the present disclosure may also be applied to a read operation for outputting 'N'-bit data and a read operation for outputting 'M'-bit data before and after the bubble period (where, 'N' and 'M' denote natural numbers).

According to the described embodiment above, a control signal for determining a burst sequence may be latched in a burst mode in which data having a predetermined number of bits are outputted before and after a bubble period. Thus, the same burst sequence may be applied before and after the bubble period.

Figure 18:
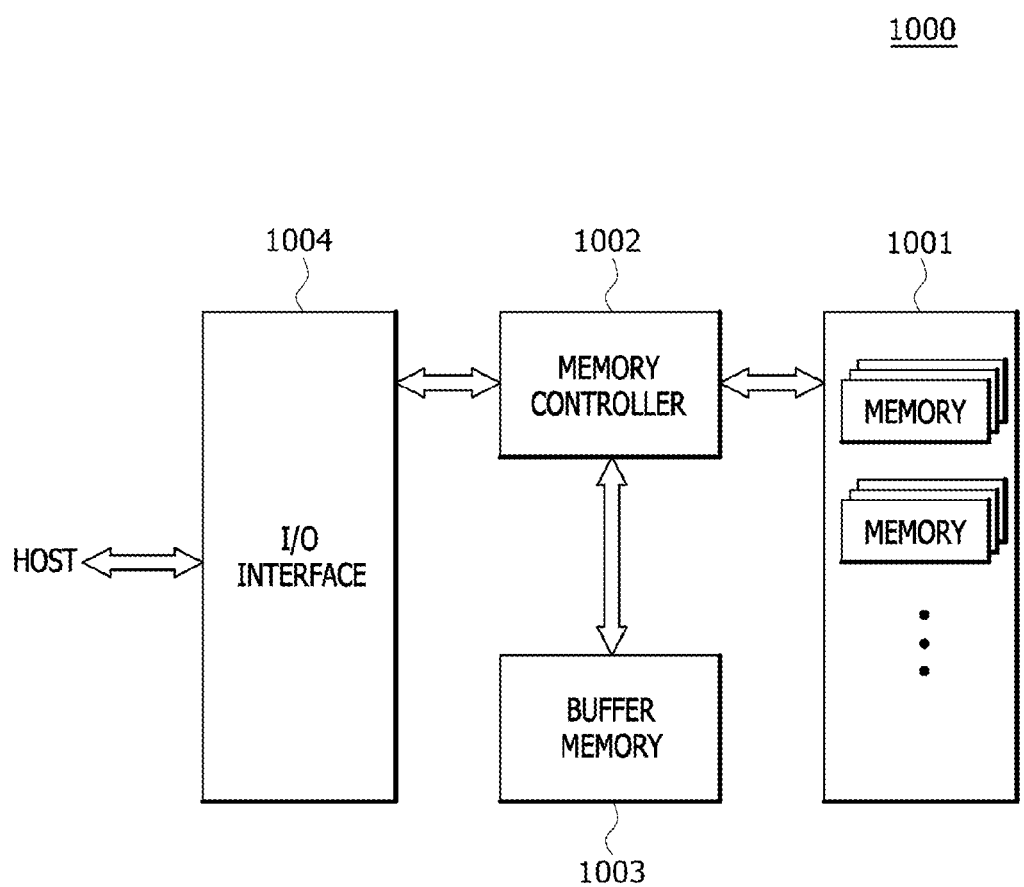
FIG. 18 is a block diagram illustrating a configuration of an electronic system employing the semiconductor device illustrated in FIG. 1.

The semiconductor device 1 illustrated in FIG. 1 may be applied to an electronic system that includes a memory system, a graphic system, a computing system, a mobile system, or the like. For example, as illustrated in FIG. 18, an electronic system 1000 according to an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal outputted from the memory controller 1002. The data storage circuit 1001 may include the semiconductor device 1 illustrated in FIG. 1. Meanwhile, the data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 18 illustrates the memory controller 1002 with a single block, the memory controller 1002 may include one controller for controlling the data storage circuit 1001 and another controller for controlling the buffer memory 1003 comprised of a volatile memory.

The buffer memory 1003 may temporarily store the data to be processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, a static random access memory (SRAM), etc.

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data outputted from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI), an integrated drive electronics (IDE), etc.

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor device comprising:
a synthesis control signal generation circuit configured to generate a synthesis control signal for determining a burst sequence from a latch control signal in response to a first burst mode command and a second burst mode command; and
a data output control circuit configured to output data included in a bank group as internal data in response to the synthesis control signal,
wherein the synthesis control signal after a bubble period is set to have the same logic level as the synthesis control signal before the bubble period when the second burst mode command is generated.

2. The semiconductor device of claim 1,
wherein the first burst mode command is generated to perform a first burst operation whose burst length is set to be 'N' such that 'N'-bit data stored in the bank group are outputted;
wherein the second burst mode command is generated to perform a second burst operation whose burst length is set to be 'M' such that 'M'-bit data stored in the bank group are outputted; and
wherein 'N' and 'M' denote natural numbers.

3. The semiconductor device of claim 2,
wherein 'M' is set to be equal to '2N'; and
wherein the second burst operation is performed to output 'N'-bit data selected according to the burst sequence among the 'M'-bit data stored in the bank group before the bubble period and to output the remaining 'N'-bit data among the 'M'-bit data stored in the bank group after the bubble period elapses.

4. The semiconductor device of claim 3, wherein the bubble period is set as a time period that is able to support the outputting of the 'N'-bit data.

5. The semiconductor device of claim 3,
wherein the 'M'-bit data stored in the bank group include first group data having 'N'-bit data and second group data having 'N'-bit data;
wherein when the synthesis control signal has a first logic level during the second burst operation, the first group data are outputted before the bubble period and the second group data are outputted after the bubble period elapses from a point of time that the first group data are outputted; and
wherein when the synthesis control signal has a second logic level during the second burst operation, the second group data are outputted before the bubble period and the first group data are outputted after the bubble period elapses from a point of time that the second group data are outputted.

6. The semiconductor device of claim 1, wherein the synthesis control signal generation circuit receives divided pulses and synthesized division pulses to generate the synthesis control signal.

7. The semiconductor device of claim 6,
wherein the synthesis control signal generation circuit latches the latch control signal to generate the synthesis control signal when the first burst mode command is generated; and
wherein the synthesis control signal generation circuit latches the latch control signal to generate the synthesis control signal when the divided pulses and the synthesized division pulses are generated.

8. The semiconductor device of claim 6, further comprising a pulse division circuit configured to generate the divided pulses and the synthesized division pulses in response to the first burst mode command and the second burst mode command.

9. The semiconductor device of claim 8, wherein the pulse division circuit includes:
a burst pulse generation circuit configured to generate a first burst pulse and a second burst pulse from a read pulse in response to a burst mode level signal;
an internal read pulse generation circuit configured to delay the second burst pulse to generate an internal read pulse; and
a divided pulse generation circuit configured to divide the second burst pulse to generate the divided pulses.

10. The semiconductor device of claim 9, wherein the read pulse is created when the first burst mode command or the second burst mode command is generated.

11. The semiconductor device of claim 9,
wherein the burst mode level signal is set to have a first logic level when the first burst mode command is generated;
wherein the burst mode level signal is set to have a second logic level when the second burst mode command is generated; and
wherein the burst mode level signal is set to have the second logic level after a predetermined period elapses from a point of time that the second burst mode command is generated.

12. The semiconductor device of claim 9, wherein the internal read pulse generation circuit delays the second burst pulse by a period in which a burst operation corresponding to the second burst mode command is performed, thereby generating the internal read pulse.

13. The semiconductor device of claim 9,
wherein the divided pulse generation circuit generates a first bit of the divided pulses when the second burst pulse is firstly generated; and
wherein the divided pulse generation circuit generates a second bit of the divided pulses when the second burst pulse is secondly generated.

14. The semiconductor device of claim 9, wherein the pulse division circuit further includes:
an internal divided pulse generation circuit configured to divide the internal read pulse to generate internal divided pulses; and
a pulse synthesis circuit configured to synthesize the divided pulses and the internal divided pulses to generate the synthesized division pulses.

15. The semiconductor device of claim 14,
wherein the internal divided pulse generation circuit generates a first bit of the internal divided pulses when the internal read pulse is firstly created; and
wherein the internal divided pulse generation circuit generates a second bit of the internal divided pulses when the internal read pulse is secondly created.

16. A semiconductor device comprising:
a pulse division circuit configured to generate divided pulses and synthesized division pulses in response to a first burst mode command and a second burst mode command; and
a synthesis control signal generation circuit configured to generate a synthesis control signal for determining a burst sequence from a latch control signal in response to the first burst mode command, the second burst mode command, the divided pulses, and the synthesized division pulses, wherein the synthesis control signal after a bubble period is set to have the same logic level as the synthesis control signal before the bubble period when the second burst mode command is generated.

17. The semiconductor device of claim 16, wherein the pulse division circuit includes:
 a burst pulse generation circuit configured to generate a first burst pulse and a second burst pulse from a read pulse in response to a burst mode level signal;
 an internal read pulse generation circuit configured to delay the second burst pulse to generate an internal read pulse;
 a divided pulse generation circuit configured to divide the second burst pulse to generate the divided pulses;
 an internal divided pulse generation circuit configured to divide the internal read pulse to generate internal divided pulses; and
 a pulse synthesis circuit configured to synthesize the divided pulses and the internal divided pulses to generate the synthesized division pulses.

18. The semiconductor device of claim 16,
wherein the first burst mode command is generated to perform a first burst operation whose burst length is set to be 'N' such that 'N'-bit data stored in a bank group are outputted;

wherein the second burst mode command is generated to perform a second burst operation whose burst length is set to be 'M' such that 'M'-bit data stored in the bank group are outputted; and wherein 'N' and 'M' denote natural numbers.

19. The semiconductor device of claim 18, wherein the 'M'-bit data stored in the bank group include first group data having 'N'-bit data and second group data having 'N'-bit data;

wherein when the synthesis control signal has a first logic level during the second burst operation, the first group data are outputted before the bubble period and the second group data are outputted after the bubble period elapses from a point of time that the first group data are outputted; and wherein when the synthesis control signal has a second logic level during the second burst operation, the second group data are outputted before the bubble period and the first group data are outputted after the bubble period elapses from a point of time that the second group data are outputted.

20. The semiconductor device of claim 18, wherein the bubble period is set as a time period that is able to support the outputting of the 'N'-bit data.

* * * * *